(12) United States Patent
Shin et al.

(10) Patent No.: US 10,971,809 B2
(45) Date of Patent: Apr. 6, 2021

(54) ELECTRONIC DEVICE INCLUDING ANTENNA CONNECTED WITH CONDUCTIVE SHEET OF DISPLAY PANEL

(71) Applicant: SAMSUNG ELECTRONICS CO., LTD., Suwon-si (KR)

(72) Inventors: Dongryul Shin, Suwon-si (KR);
Himchan Yun, Suwon-si (KR);
Yoonjae Lee, Suwon-si (KR);
Sunghyup Lee, Suwon-si (KR);
Heeseok Jung, Suwon-si (KR);
Seungki Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/661,071

(22) Filed: Oct. 23, 2019

(65) Prior Publication Data
US 2020/0136243 A1    Apr. 30, 2020

(30) Foreign Application Priority Data

Oct. 24, 2018    (KR) .................. 10-2018-0127098

(51) Int. Cl.
*H01Q 1/24*    (2006.01)
*H01Q 1/38*    (2006.01)
(Continued)

(52) U.S. Cl.
CPC ............... *H01Q 1/38* (2013.01); *H01Q 1/243* (2013.01); *H05K 1/147* (2013.01); *H05K 5/0017* (2013.01);
(Continued)

(58) Field of Classification Search
CPC .......... H01Q 1/241; H01Q 1/243; H01Q 1/38; H01Q 1/44; H01Q 1/48; H01Q 3/01;
(Continued)

(56) References Cited

U.S. PATENT DOCUMENTS 7,589,975 B2   9/2009  Ootani
2006/0050490 A1  3/2006  Ootani
(Continued)

FOREIGN PATENT DOCUMENTS

JP   2006-073840    3/2006
KR   10-2017-0040082  4/2017
KR   10-2017-0100972  9/2017

OTHER PUBLICATIONS

International Search Report and Written Opinon dated Feb. 18, 2020 in counterpart International Patent Application No. PCT/KR2019/013550.

*Primary Examiner* — Hoang V Nguyen
(74) *Attorney, Agent, or Firm* — Nixon & Vanderhye, P.C.

(57) ABSTRACT

An electronic device includes glass comprising at least a front surface of the electronic device, a display panel disposed under the glass, a conductive sheet attached to the display panel or integrated into the display panel, a support including a first portion comprising a side surface of the electronic device and a second portion comprising a mounting space for parts, in which the first portion of the support includes a metal portion comprising a radiator, and insulation portions disposed at opposite ends of the metal portion, and the second portion of the support includes at least one via hole or recess, a printed circuit board (PCB) including a ground, wireless communication circuitry disposed on the PCB, at least one processor operatively connected with the wireless communication circuitry, a flexible printed circuit board (FPCB) electrically connected with the conductive sheet to operatively connect the display panel with the at least one processor, and a cover comprising a rear surface of the electronic device. The glass, the display panel, and the conductive sheet are seated on a first surface of the second structure of the supporting member. The PCB and the cover (Continued)

of the electronic device are seated on a second surface of the second portion. The second portion of the support electrically connects the support with the ground of the PCB by making contact with one of conductive contacts of the PCB on at least one point. The FPCB includes a first path extending from the first surface to the second surface through the at least one via hole or the recess of the support. The first path of the FPCB extending to the second surface electrically connects the conductive sheet with the ground of the PCB. The conductive sheet is electrically connected with the metal portion of the support through a selection part comprising selective connection circuitry. The wireless communication circuitry receives a signal having a specific frequency band based on an electrical path comprising the wireless communication circuitry, the metal portion of the support, the selection part, and the conductive sheet.

20 Claims, 20 Drawing Sheets

(51) Int. Cl.
*H05K 5/00* (2006.01)
*H05K 1/14* (2006.01)
*H05K 5/03* (2006.01)

(52) U.S. Cl.
CPC .......... *H05K 5/03* (2013.01); *H05K 2201/056* (2013.01); *H05K 2201/10098* (2013.01); *H05K 2201/10128* (2013.01)

(58) Field of Classification Search
CPC .......... H01Q 5/30; H05K 5/0017; H05K 5/03; H05K 1/147
See application file for complete search history.

(56) References Cited

U.S. PATENT DOCUMENTS

| | | |
|---|---|---|
| 2012/0081875 A1 | 4/2012 | Yamaguchi et al. |
| 2015/0062460 A1 | 3/2015 | Yamada |
| 2016/0254832 A1* | 9/2016 | Yoo .......................... H01Q 9/42 |
| | | 455/575.5 |
| 2017/0250460 A1 | 8/2017 | Shin et al. |
| 2017/0263998 A1* | 9/2017 | Park .......................... H01Q 1/50 |
| 2018/0017999 A1 | 1/2018 | Kim et al. |

* cited by examiner

ELECTRONIC DEVICE INCLUDING ANTENNA CONNECTED WITH CONDUCTIVE SHEET OF DISPLAY PANEL

CROSS-REFERENCE TO RELATED APPLICATION(S)

This application is based on and claims priority under 35 U.S.C. § 119 to Korean Patent Application No. 10-2018-0127098, filed on Oct. 24, 2018, in the Korean Intellectual Property Office, the disclosure of which is incorporated by reference herein its entirety.

BACKGROUND

1. Field

The disclosure relates to connecting an antenna included in an electronic device with a conductive sheet of a display panel.

2. Description of Related Art

As a mobile communication technology is developed, the electronic device including an antenna has been extensively spread. The electronic device may transmit and/or receive a radio frequency (RF) signal including a voice signal or data (e.g., a message, a photo, a moving picture, a music file, or the like) using the antenna.

The electronic device may include a display to display an image. The display includes a conductive sheet to block noise from being introduced into an electrical circuit constituting the display.

Recently, an electronic device, such as a smartphone, has been designed to have a significantly small bezel area to ensure the maximum screen size while maintaining a small device size. In this case, as the display panel is significantly close to a side member of the electronic device, even the conductive sheet is significantly close to the side member.

Meanwhile, an electronic device having a metal side member utilizes a portion of the metal side member as an antenna.

The above information is presented as background information only to assist with an understanding of the disclosure. No determination has been made, and no assertion is made, as to whether any of the above might be applicable as prior art with regard to the disclosure.

When the display panel of the electronic device is expanded to be close to the side member, the distances between the side member and a feeder of the antenna, and the display panel may be decreased. When the conductive sheet of the display panel is a floating ground, the radiation efficiency of the antenna may be lowered.

In addition, when the supporting member (e.g., the bracket) is directly connected with the conductive sheet of the display panel through a connection part to prevent the radiation efficient from being lowered, a pressed phenomenon may occur in an area of the display panel having the connection part disposed therein. When the pressed phenomenon is caused in the area of the display panel, the pixel on the display panel may be degraded or a dead pixel recognized as a dark point may be formed due to the pressure applied to the display panel, and a leakage current may be caused.

SUMMARY

Embodiments of the disclosure address at least the above-mentioned problems and/or disadvantages and to provide at least the advantages described below. Accordingly, an example aspect of the disclosure is to provide an electronic device including an antenna connected with a conductive sheet of a display panel, in which the conductive sheet of the display panel is connected with the ground of a PCB to function as the ground of the antenna while preventing and/or reducing instances of pixels on the display panel being degraded.

In accordance with an example aspect of the disclosure, an electronic device may include glass comprising a front surface of the electronic device, a display panel disposed under the glass, a conductive sheet attached to the display panel or integrated into the display panel, a support including a side surface of the electronic device and a mounting space for parts, wherein a first portion of the support includes a metal portion configured as a radiator, and insulation portions disposed at opposite ends of the metal portion, and a second portion of the support includes at least one via hole or recess, a printed circuit board (PCB) including a ground, a wireless communication circuit disposed on the PCB, at least one processor operatively connected with the wireless communication circuit, a flexible PCB (FPCB) electrically connected with the conductive sheet and configured to operatively connect the display panel with the at least one processor, and a cover comprising a rear surface of the electronic device. The glass, the display panel, and the conductive sheet may be seated on a first surface of the second portion of the support. The PCB and the cover of the electronic device may be seated on a second surface of the second portion of the support. The second portion of the support may electrically connect the support with a ground of the PCB by making contact with one of conductive contacts of the PCB on at least one point. The FPCB may include a first path extending from the first surface to the second surface through the at least one via hole or recess of the support. The first path of the FPCB extending to the second surface may electrically connect the conductive sheet with the ground of the PCB. The conductive sheet may be electrically connected with the metal portion of the support through a selection part comprising a selective connector. The wireless communication circuit may be configured to receive a signal having a specific frequency band based on an electrical path including the wireless communication circuit, the metal portion of the support, the selection part, and the conductive sheet.

In accordance with another example aspect of the disclosure, an electronic device includes glass comprising a front surface of the electronic device, a display panel disposed under the glass, a conductive sheet attached to the display panel or integrated with the display panel, a housing including a side portion comprising a side surface of the electronic device and a rear plate comprising a rear surface of the electronic device, wherein the side portion includes a metal portion configured to function as a radiator, and an insulation portion which separates the metal portion from a remaining portion of the housing, a PCB including a ground, a support configured to separate the glass, the display panel, and the conductive sheet from the PCB, and the support including at least one via hole or recess, wireless communication circuitry disposed on the PCB, at least one processor operatively connected with the wireless communication circuitry, and an FPCB electrically connected with the conductive sheet configured to operatively connect the display panel with the at least one processor. The glass, the display panel, and the conductive sheet are seated on a first surface of the support, the PCB is disposed on a second surface of the support, and the rear plate is configured to electrically connect the housing with the ground of the PCB by making contact with one of conductive contacts of the PCB on at least one point, the FPCB having a first path extending from the first surface to the second surface through the at least one via hole or recess of the support, the first path of the FPCB extending to the second surface electrically connecting the conductive sheet with the ground of the PCB, the conductive sheet is electrically connected with the metal portion of the side portion through a selection part comprising a selective connector, and the wireless communication circuitry is configured to receive a signal having a specific frequency band based on an electrical path formed by the wireless communication circuitry, the metal portion of the side portion, the selection part, and the conductive sheet.

In accordance with another example aspect of the disclosure, an electronic device may include a housing including an antenna radiator, a display panel disposed inside the housing, a conductive sheet attached to the display panel or integrated with the display panel, a PCB including a ground, wireless communication circuitry disposed on the PCB configured to feed power to the antenna radiator, and at least one processor operatively connected with the wireless communication circuitry. The conductive sheet may be electrically connected with the ground of the PCB, and the wireless communication circuitry may be configured to receive a signal having a specific frequency band based on an electrical path between the wireless communication circuitry and the antenna radiator, or between the antenna radiator and the conductive sheet.

Other aspects, advantages, and salient features of the disclosure will become apparent to those skilled in the art from the following detailed description, which, taken in conjunction with the annexed drawings, discloses various example embodiments of the disclosure.

BRIEF DESCRIPTION OF THE DRAWINGS

The above and other aspects, features, and advantages of certain embodiments of the disclosure will be more apparent from the following detailed description taken in conjunction with the accompanying drawings, in which.

In the following description made with respect to the accompanying drawings, similar components will be assigned with similar reference numerals.

DETAILED DESCRIPTION

Hereinafter, various example embodiments of the disclosure may be described with reference to accompanying drawings. However, those of ordinary skill in the art will understand that the disclosure is not limited to a specific embodiment, and modifications, equivalents, and/or alternatives of the various example embodiments described herein can be variously made without departing from the scope and spirit of the disclosure.

Figure 1:
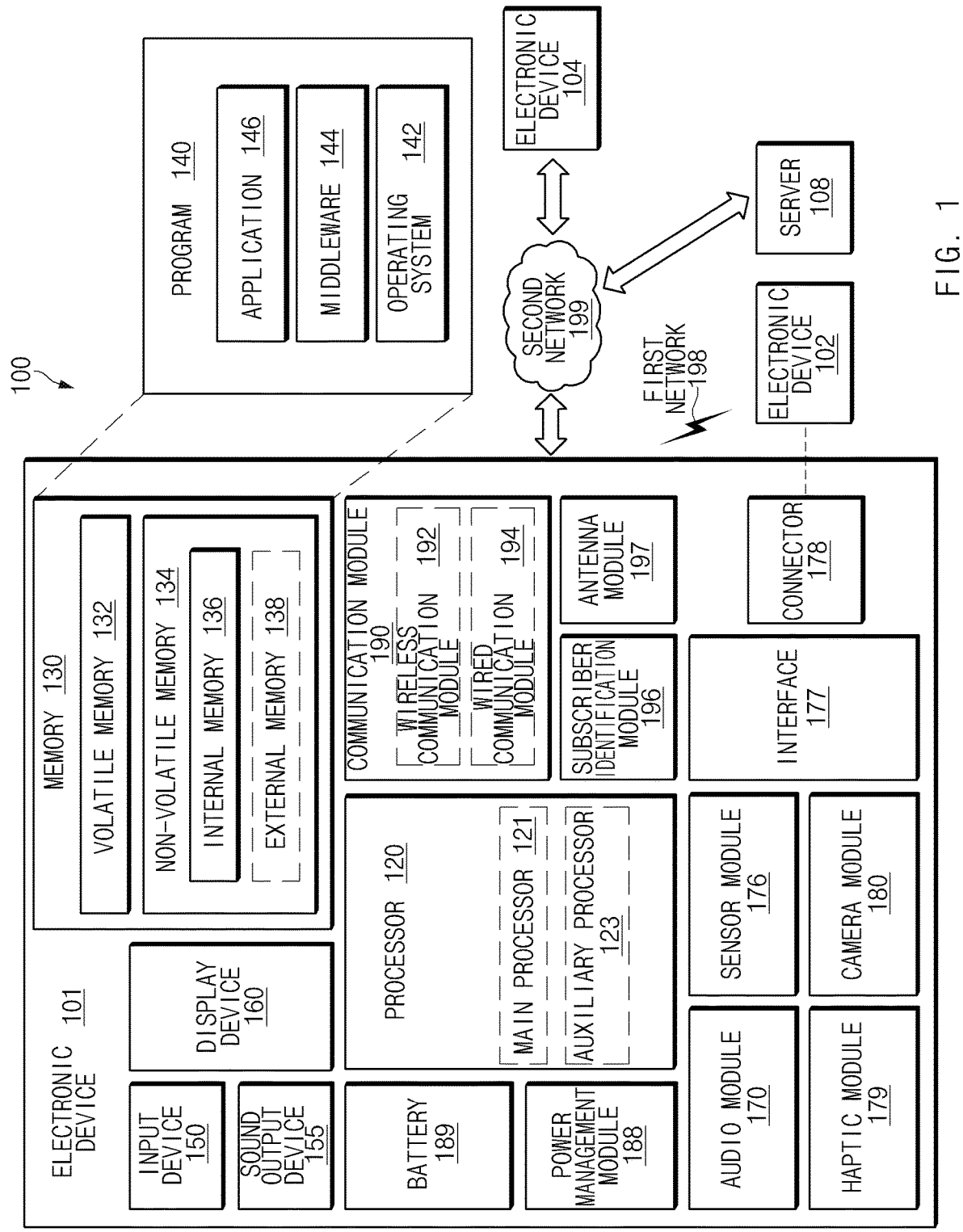
FIG. 1 is a block diagram illustrating an example electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an example embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an example embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
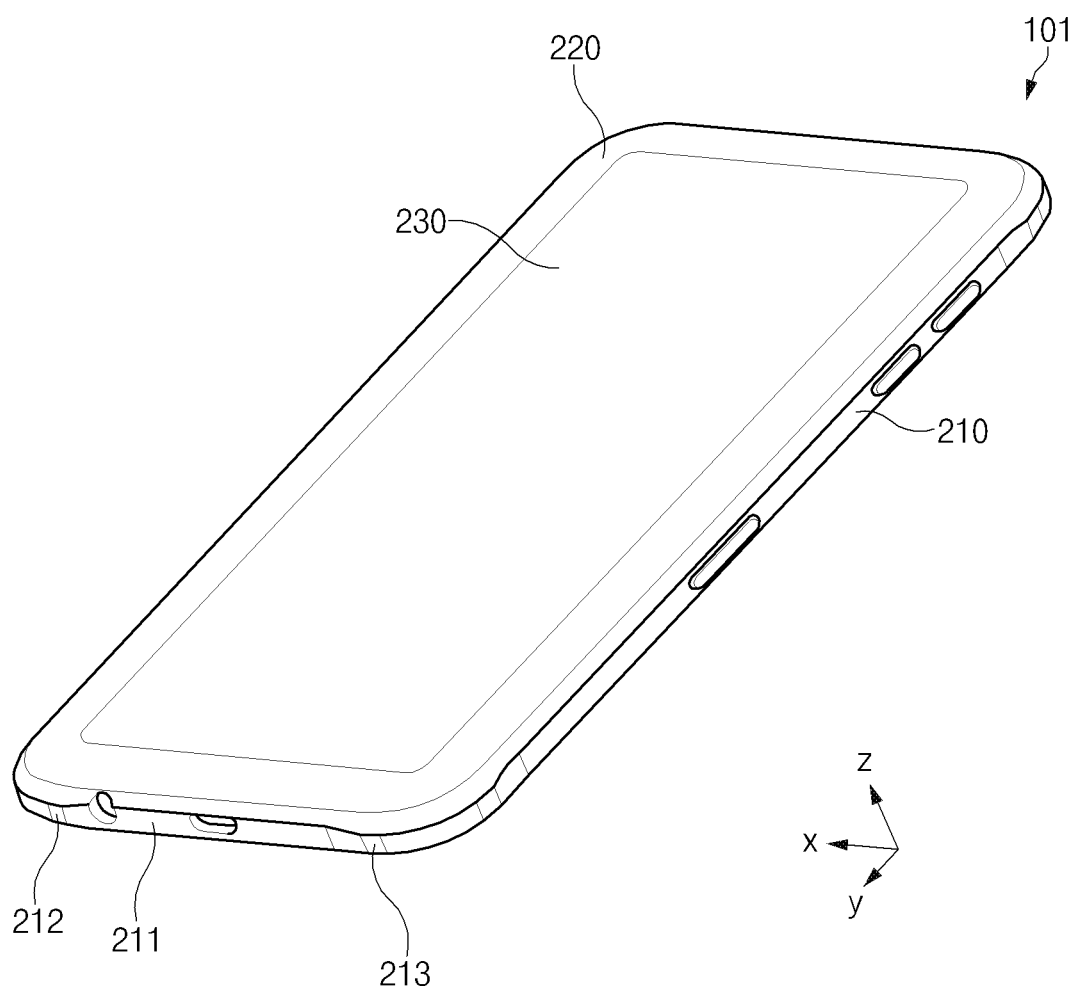
FIG. 2 is a front perspective view illustrating an example electronic device, according to an embodiment.

FIG. 2 is a front perspective view illustrating the electronic device 101, according to an embodiment. According to an embodiment, the electronic device 101 may include a housing including at least some of a first surface (or front surface), a second surface (or rear surface), and a side surface surrounding the space between the first surface and the second surface.

According to an embodiment, at least a portion of the first surface of the housing may comprise or be formed of a glass 220 which may be substantially transparent. The glass 220 may be formed of a glass plate or a polymer plate including various coating layers. The second surface of the housing may be formed of a cover which is substantially opaque. The cover may be formed of, for example, coated or colored glass, ceramic, polymer, metal (e.g., aluminum, stainless steel (STS), or magnesium) or the combination of the above materials According to an embodiment, a display panel 230 may be disposed under the glass 220. At least a portion of the display panel 230 may be exposed through the glass 220. According to an embodiment, the corner of the display panel 230 may have the same shape as that of an outer portion, which is close to the corner of the display panel 230, of the glass 220. According to another embodiment, to expand an exposed area of the display panel 230, the distance between an outer portion of the display panel 230 and an outer portion of the glass 220 may be substantially uniformly formed.

According to an embodiment, the side surface of the housing may be formed by a first structure 210 of a supporting member. It will be understood that, as used herein, the first structure may be referred to as a first portion of the supporting member or support including a side surface of the housing. Further, as used herein, the first structure may be referred to interchangeably with a first portion and the supporting member may be used interchangeably with side surface of the housing or support. The first structure 210 may be coupled to the glass 220 and a cover 270 (see, e.g., FIG. 3). The first structure 210 may include metal/polymer in at least a portion thereof.

According to an embodiment, the first structure 210 may include a metal portion 211 and insulation portions 212 and 213. The metal portion 211 may operate as a radiator. For example, the metal portion 211 may radiate a radio frequency (RF) signal, which is supplied from the wireless communication circuitry (e.g., the communication module 190 of FIG. 1), to the outside. The insulation portions 212 and 213 may be disposed at opposite ends of the metal portion 211. The insulation portions 212 and 213 may electrically isolate the metal portion 211 serving as the radiator from a remaining portion of the first structure 210.

Figure 3:
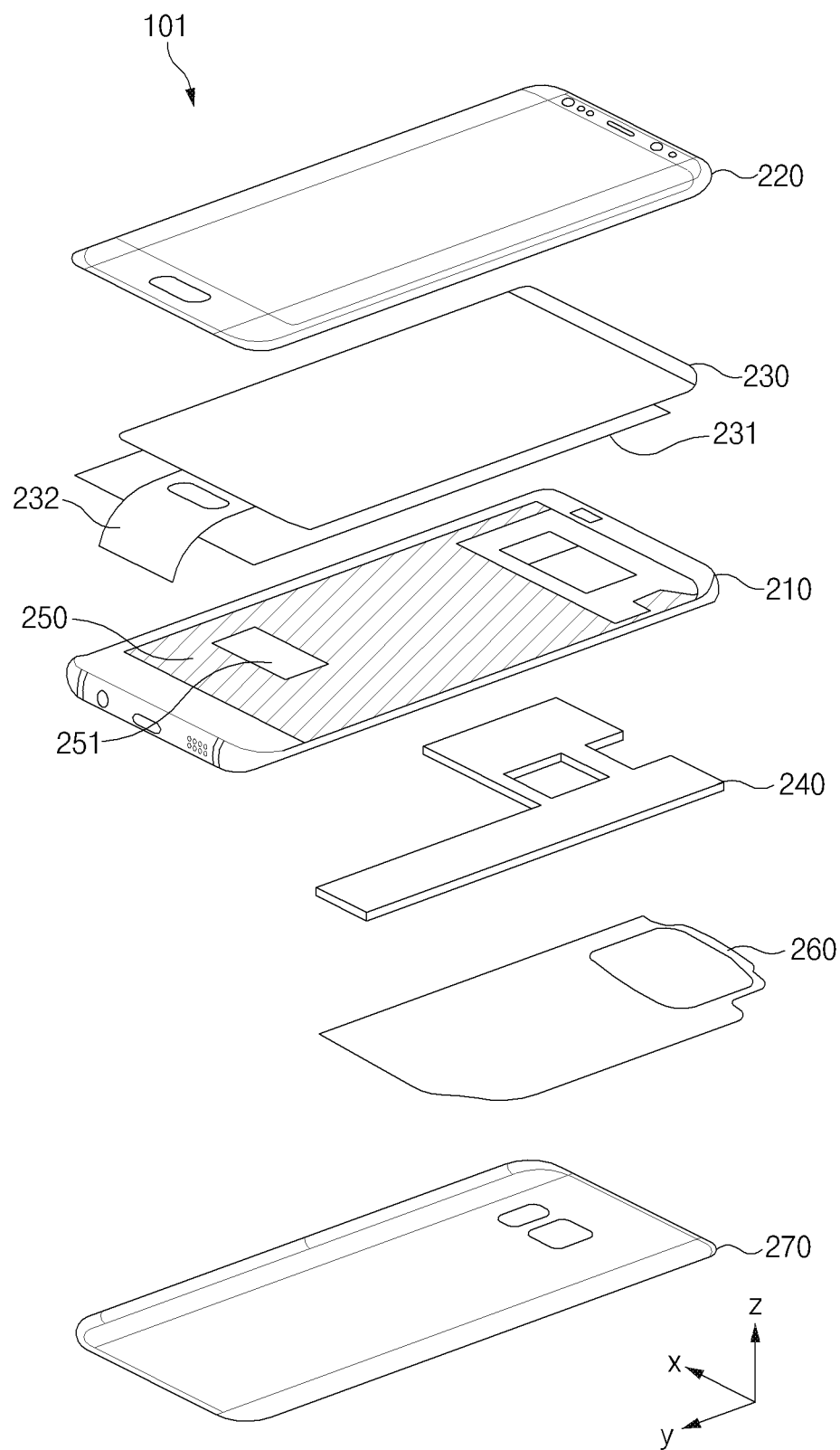
FIG. 3 is an exploded perspective view illustrating an example electronic device, according to an embodiment.

FIG. 3 is an exploded perspective view illustrating the electronic device 101, according to an embodiment.

According to an embodiment, the electronic device 101 may include the glass 220, the display panel 230, a conductive sheet 231, a flexible printed circuit board (FPCB) 232, supporting members (e.g., support or side housing) 210 and 250 including the first structure 210 and a second structure (e.g., a second portion of the support or side housing) 250, a printed circuit board (PCB) 240, and a short-range communication circuit 260, and the cover 270. In an embodiment, the electronic device 101 may not include at least one of the above-described components or may further include any other component(s). At least one of components of the electronic device 101 illustrated in FIG. 3 may be the same as or similar to at least one of components of the electronic device 101 of FIG. 2, and the duplicated description thereof may not be repeated below.

According to an embodiment, the display panel 230 may be disposed under the glass 220. The display panel 230 may be seated on the first surface of the second structure 250. The display panel 230 may be connected with the processor (e.g., the processor 120 of FIG. 1) of the electronic device 101 using the FPCB 232. The display panel 230 may receive image data from the processor 120 and may display an image to be displayed by the processor 120.

In an embodiment, the conductive sheet 231 may be disposed on one surface of the display panel 230. The conductive sheet 231 may be a ground layer to function as the ground of the display panel 230. The conductive sheet 231 may, for example, be implemented with a metal plate (e.g., a copper (Cu) sheet) or graphite. The conductive sheet 231 may suppress an electromagnetic field introduced into or discharged out of the display panel 230. The conductive sheet 231 may disperse heat emitted from the display panel 230.

In an embodiment, the FPCB 232 may connect the display panel 230 with the processor 120. The FPCB 232 may receive image data from the processor 120 and may transmit the image data to the display panel 230.

According to an embodiment, the supporting members 210 and 250 may include the first structure 210 to form a side surface of the electronic device 101 and the second structure 250 to form a mounting structure for parts. As set forth above, the supporting members may be referred to herein as a support and the first and second structures of the supporting members may be referred to herein as first and second portions of the support. The second structure 250 may be disposed in the electronic device 101 and may include a via hole 251. The second structure 250 may be connected with the first structure 210. For example, the second structure 250 may be formed integrally with the first structure 210 while extending inward from the center of the side surface of the first structure 210. At least a portion of the second structure 250 may be formed of a metal material and/or a polymer material. The display panel 230 may be coupled to the first surface of the second structure 250. The PCB 240 may be coupled with the second surface of the second structure 250.

According to an embodiment, the processor (e.g., the processor 120 of FIG. 1) may be disposed on the PCB 240. The processor 120 may include, for example, one or more of a central processing unit, an application processor, a graphics processing unit, an image signal processor, a sensor hub processor, or a communications processor According to an embodiment, a wireless communication circuitry may be disposed on the PCB 240. The wireless communication circuitry may make communication with an external device.

According to an embodiment, the PCB 240 may include the ground. The ground of the PCB 240 may function as the ground of the antenna implemented using the wireless communication circuitry.

According to an embodiment, the short-range communication circuit 260 may make short-range communication with an external device or may transmit and/or receive power necessary for charging in wireless. For example, the short-range communication circuit 260 may be implemented with near field communication (NFC) or magnetic secure transmission (MST).

Figure 4:
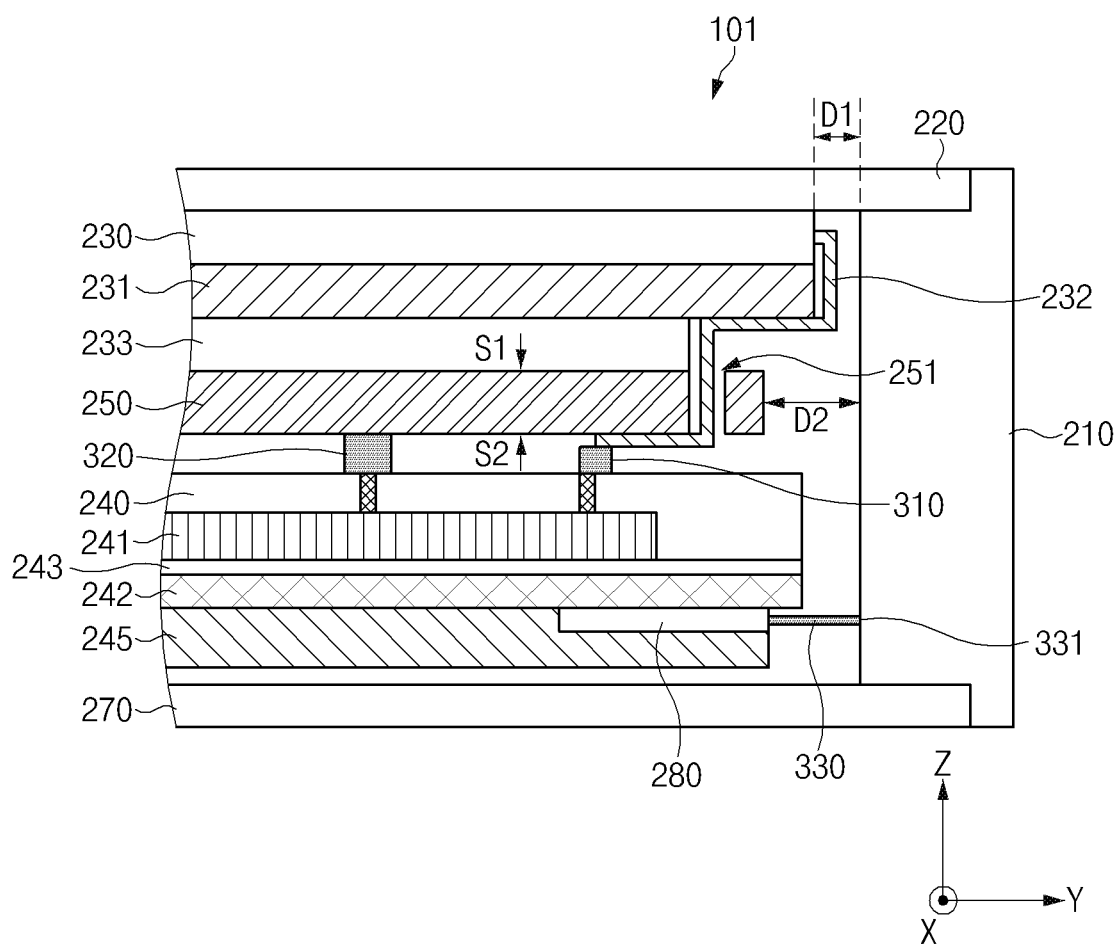
FIG. 4 is a cross-sectional view illustrating an example electronic device, according to an embodiment.

In an embodiment, the cover 270 may form a rear surface of the electronic device 101. The cover 270 may protect the electronic device 101 from an external impact or foreign matters FIG. 4 is a cross-sectional view illustrating the electronic device 101, according to an embodiment. The electronic device 101 may include at least one of the first structure 210 and the second structure 250 of the supporting members 210 and 250, the glass 220, the display panel 230, the conductive sheet 231, the FPCB 232, the PCB 240, a wireless communication circuitry 245, the cover 270, or a feeder 280. At least one of components of the electronic device 101 illustrated in FIG. 4 may be the same as or similar to at least one of components of the electronic device 101 of FIG. 3, and the duplicated description thereof may not be repeated below.

In an embodiment, the first structure 210 may form the edge of the side surface of the electronic device 101. At least a portion of the first structure 210 may be formed of a conductive material. The at least a portion of the first structure 210 formed of the conductive material may function as a radiator of the antenna. The at least a portion of the first structure 210 may be connected with the feeder 280 disposed on the PCB 240 using a third connection part 330 and thus function as an antenna radiator. The at least a portion of the first structure 210 may receive a signal having a specific frequency band from the feeder 280. The at least a portion of the first structure 210 may radiate the signal having the specific frequency band to the outside.

In an embodiment, the PCB 240 may be seated on a second surface S2 of the second structure 250. The wireless communication circuitry 245 may be disposed on at least one surface of the PCB 240. The PCB 240 may include a ground 241. The ground 241 may function as a ground of an antenna implemented using the feeder 280. The PCB 240 may include a transmission line 242. The transmission line 242 may connect the feeder 280 with a processor (e.g., the processor 120 of FIG. 1). The PCB 240 may include an insulation layer 243. The insulation layer 243 may be disposed between the ground 241 and the transmission line 242.

In an embodiment, the feeder 280 may be a power feeding circuit including an antenna matching circuit or a tunable circuit and/or a switch. The feeder 280 may include an RF circuit to transmit an RF signal and/or receive an RF signal, a tuner to control the central frequency of the RF circuit, and/or a switch to control the input/output of the RF signal. The feeder 280 may be connected with the processor 120 using the transmission line 242 of the PCB 240. The transmission line 242 may be electrically isolated from the ground 241 of the PCB 240 through the insulation layer 243. Accordingly, the feeder 280 may be electrically isolated from the ground 241. The feeder 280 may be electrically connected with the first structure 210 using the third connection part 330. The feeder 280 may transmit a signal having the specified frequency band to the first structure 210.

In an embodiment, the FPCB 232 may connect the conductive sheet 231 with a first connection part 310. The FPCB 232 may electrically connect the conductive sheet 231 with the ground 241 using the first connection part 310. In an embodiment, the FPCB 232 may pass through at least a portion of the second structure 250 to connect the first connection part 310 with the conductive sheet 231.

In an embodiment, the second structure 250 may include at least one via hole 251 or a recess. For example, the second structure 250 may include the via hole 251 formed through from the first surface S1 to the second surface S2. The FPCB 232 may extend from the first surface S1 of the second structure 250 to the second surface S2 of the second structure 250 using at least one via hole 251 or recess included in the second structure 250.

In an embodiment, the first structure 210, the third connection part 330, and the first connection part 310 may form an antenna implemented in a planar inverted-F antenna (PIFA) scheme. The first structure 210 may form the radiator of the antenna. The third connection part 330 may perform feeding from the feeder 280 to the first structure 210. The first connection part 310 may function as a ground connection part for the use as the ground of the antenna. The conductive sheet 231 may be connected with the ground 241 of the PCB 240 used as the ground of the antenna. When the conductive sheet 231 is utilized as a portion of the antenna using the first connection part 310, the radiation performance may be improved.

In an embodiment, the first connection part 310 may connect the conductive sheet 231 with the ground 241. One side of the first connection part 310 may make contact with the FPCB 232 connected with the conductive sheet 231. An opposite side of the first connection part 310 may make contact with the ground 241 of the PCB 240. For example, the first connection part 310 may be implemented using at least a portion of the FPCB 232. However, the disclosure is not limited thereto, and the first connection part 310 may be implemented with a C-clip, a metal wire, or a coaxial cable formed separately from the FPCB 232.

In an example embodiment, the FPCB 232 may pass through the second structure 250. The FPCB 232 may extend from the conductive sheet 231 in the direction of the first surface S1 of the second structure 250. At least one via hole 251 may be formed in at least a portion of the second structure 250 to allow the FPCB 232 to pass therethrough. The FPCB 232 may extend at least partially to the second surface of the second structure 250 through the via hole 251 formed in the second structure 250.

In an example embodiment, a second connection part 320 may electrically connect the ground 241 with the second structure 250. For example, the second connection part 320 may be implemented with a C-clip, a metal wire, or a coaxial cable. The second connection part 320 may be configured to use the second structure 250 as the ground of the antenna.

In an embodiment, the conductive sheet 231 may be interposed between the display panel 230 and the second structure 250. The conductive sheet 231 may be disposed to overlap the display panel 230. The conductive sheet 231 may be electrically connected with the FPCB 232. The conductive sheet 231 may be connected with the first connection part 310 using the FPCB 232 connected with one side of the display panel 230. The FPCB 232 may connect the conductive sheet 231 with the ground 241 of the PCB 240 through the first connection part 310. In another embodiment, the FPCB 232 may constitute at least a portion of the first connection part 310.

In an embodiment, the display panel 230 may be interposed between the glass 220 and the conductive sheet 231. The display panel 230 may be spaced apart from the first structure 210 of the supporting members 210 and 250 by a first distance D1 in the first direction (e.g., a Y axis direction). When the conductive sheet 231 is connected with the ground 241 using the first connection part 310, even if the display panel 230 extends in the direction of the first structure 210, the display panel 230 may be prevented from and/or reduce being pressed by the first connection part 310. When the first distance D1 is decreased, a screen having the reduced bezel of the electronic device may be provided for a user. The second structure 250 may be spaced apart from the first structure 210 in the first direction by a second distance D2. The second distance D2 may be greater than the first distance D1.

In an embodiment, the PCB 240 may be interposed between the second structure 250 and the cover 270. The first connection part 310 and the second connection part 320 may be disposed on the PCB 240 in the direction of a Z axis.

In an embodiment, the second structure 250 may be interposed between the conductive sheet 231 and the PCB 240. The second structure 250 may have at least one via hole 251. The FPCB 232 may extend in the direction of the Z axis from the first surface S1 of the second structure 250 to the second surface S2 of the second structure 250 through the via hole 251. An adhesive layer 233 may be interposed between the second structure 250 and the conductive sheet 231 in such a manner that the adhesive layer 233 is prevented from or avoids overlapping the via hole 251. The adhesive layer 233 may couple the second structure 250 to the conductive sheet 231.

In an embodiment, the first connection part 310 may connect the FPCB 232 with the ground 241 of the PCB 240. The first connection part 310 may protrude, for example, from the PCB 240. At least a portion of the first connection part 310 may make contact with at least a portion of the FPCB 232. For example, a top surface of the first connection part 310 may make contact with a part of the FPCB 232 extending through the via hole 251.

In an embodiment, the FPCB 232 may include one or more conductive contacts to be electrically connected with the first connection part 310. The conductive contacts may make contact with the upper portion of the first connection part 310.

In an example embodiment, the second connection part 320 may electrically connect the ground 241 with the second structure 250. The second connection part 320 may protrude, for example, from the PCB 240. At least a portion of the second connection part 320 may make contact with the second surface S2 of the second structure 250.

In an embodiment, the third connection part 330 may connect the feeder 280 with the first structure 210. The third connection part 330 may be a power feeding line to feed power to the first structure 210. The third connection part 330 may be implemented with a C-clip, a structure extending from the first structure 210, a pogo pin, or a screw. The third connection part 330 may be connected with the first structure 210 at a contact 331.

Figure 5:
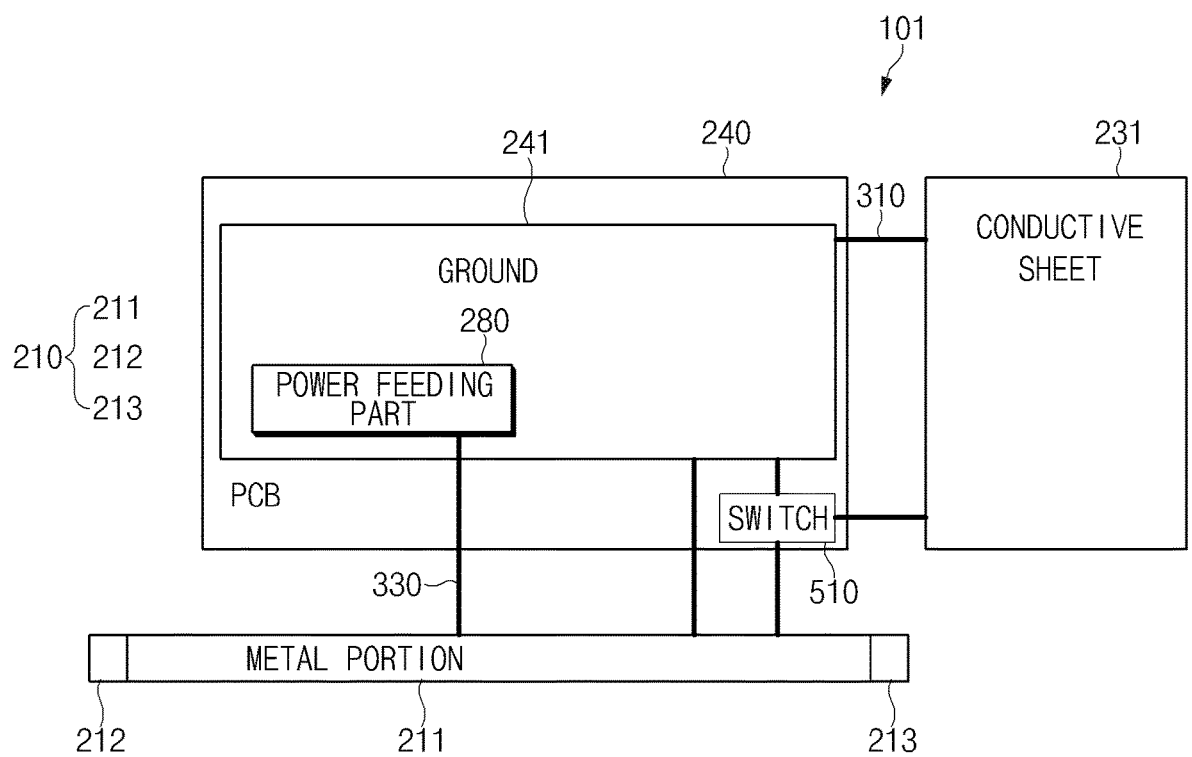
FIG. 5 is a diagram illustrating a first structure (e.g., a first portion of a support), a PCB, and a conductive sheet of an electronic device, according to an embodiment.

FIG. 5 is a diagram illustrating the first structure 210, the PCB 240, and the conductive sheet 231 of the electronic device 101, according to an embodiment. At least one of components of the electronic device 101 illustrated in FIG. 5 may be the same as or similar to at least one of components of the electronic device 101 of FIGS. 3 and 4, and the duplicated description thereof may not be repeated below.

In an embodiment, the first structure 210 may form the edge of the side surface of the electronic device 101. The first structure 210 may include the metal portion 211 and insulation portions 212 and 213. The metal portion 211 may be fed with power from the feeder 280 using the third connection part 330 and may radiate the signal having the specific frequency. The metal portion 211 may be connected with the ground 241 of the PCB 240. The insulation portions 212 and 213 may be disposed at opposite sides of the metal portion 211 to electrically isolate the metal portion 211 from other components of the electronic device 101.

In an embodiment, the PCB 240 may include the feeder 280, the ground 241, and a switch 510. The feeder 280 may transmit and/or receive a signal having a specific frequency. The feeder 280 may apply the signal having the specific frequency to the metal portion 211. The ground 241 is connected with the metal portion 211 to function as the ground of the antenna. The switch 510 may selectively connect the metal portion 211 with the ground 241 or may selectively connect the metal portion 211 with the conductive sheet 231.

In an embodiment, the third connection part 330 may connect the feeder 280 with the metal portion 211. The third connection part 330 may form at least a portion of an electrical path allowing the feeder 280 to apply the signal having the specific frequency to the metal portion 211.

In an embodiment, the conductive sheet 231 may be electrically connected with the ground 241 of the PCB 240 using the first connection part 310. For another example, the conductive sheet 231 may be directly connected with the metal portion 211 using the switch 510. The conductive sheet 231 may be connected with the ground 241 or the metal portion 211 to function as a portion of the antenna. When the conductive sheet 231 functions as at least a portion of the ground of the antenna, the radiation efficiency of the antenna toward the front side of the electronic device 101 may be improved.

Figure 6:
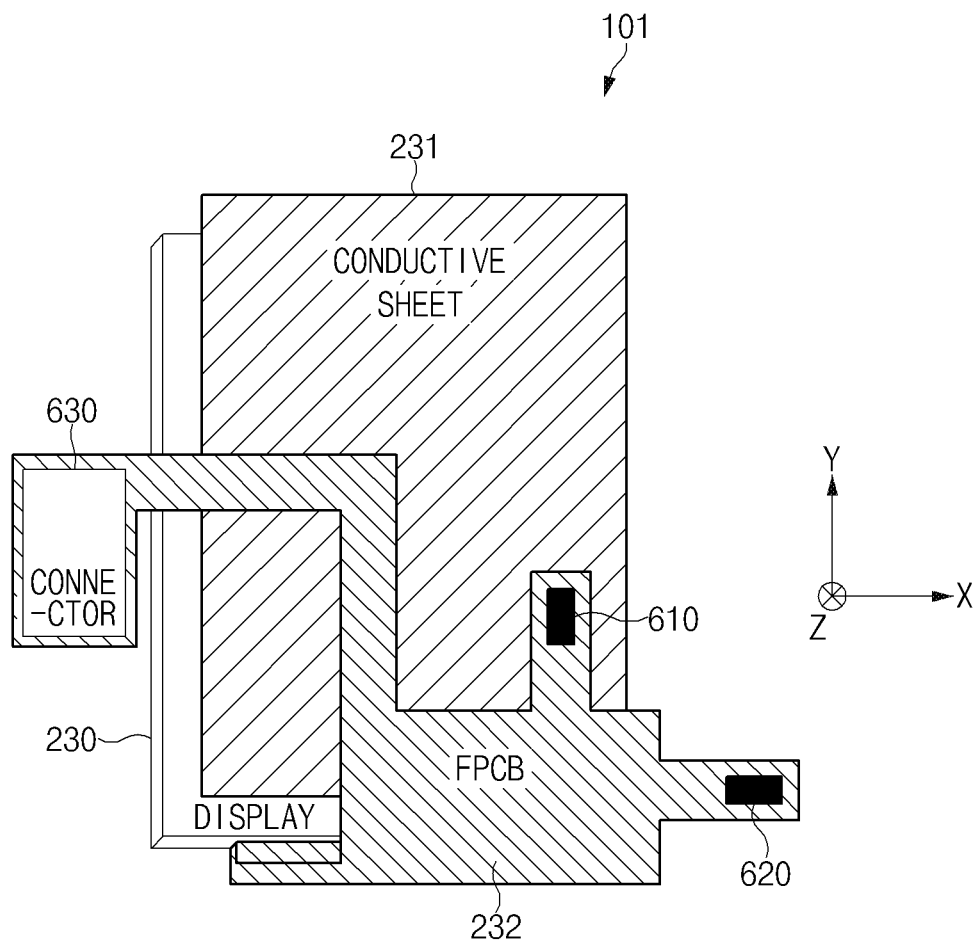
FIG. 6 is a diagram illustrating a display, a conductive sheet, and an FPCB of an electronic device, according to an embodiment.
Figure 7:
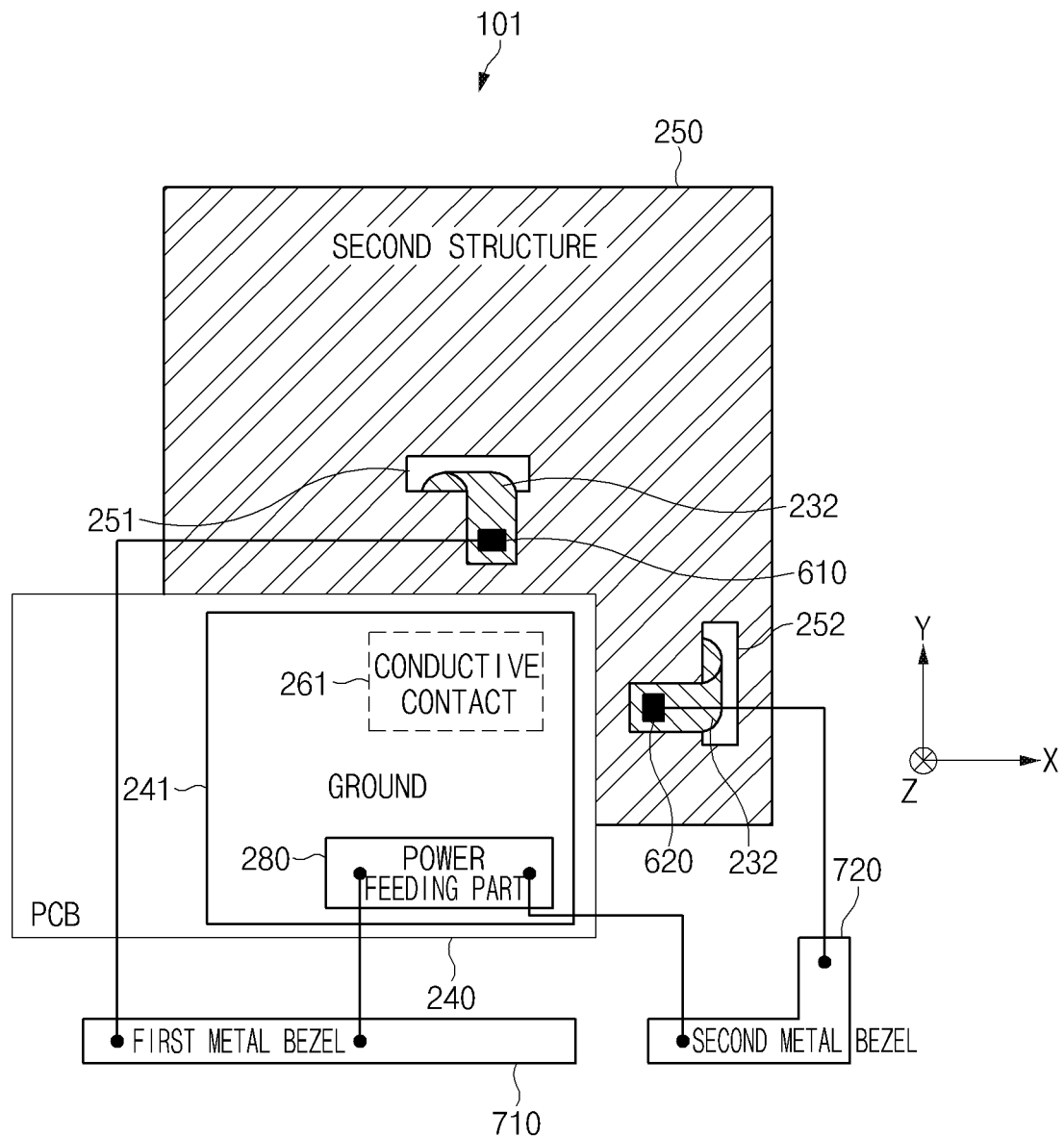
FIG. 7 is a diagram illustrating a second structure (e.g., a second portion of a support), an FPCB, a PCB, a first metal bezel, and a second metal bezel of the electronic device, according to an embodiment.

FIG. 6 is a diagram illustrating the display panel 230, the conductive sheet 231, and the FPCB 232 of the electronic device 101, according to an embodiment. FIG. 7 is a diagram illustrating the second structure 250, the FPCB 232, the PCB 240, a first metal bezel 710, and a second metal bezel 720 of the electronic device 101, according to an embodiment.

In an embodiment, the conductive sheet 231 may be disposed on the display panel 230. The FPCB 232 may extend from one side of the display panel 230. The FPCB 232 may be electrically connected with the conductive sheet 231.

In an embodiment, the FPCB 232 may include ground contacts 610 and 620 electrically connected with the ground 241 of at least PCB 240. For example, the FPCB 232 may include the first ground contact 610 connected with the ground 241 and the second ground contact 620 connected with the ground 241 at an area closer to an edge of the ground 241 than the first ground contact 610. The first ground contact 610 and the second ground contact 620 may include, for example, metal terminals.

In an embodiment, the FPCB 232 may include a connector 630. The connector 630 may receive image data from at least one processor (e.g., the processor 120 of FIG. 1) to operate the display panel 230 and may supply the data to the display panel 230.

In an embodiment, the connector 630 may electrically connect the ground 241 of the PCB 240 with the conductive sheet 231. The connector 630 may be disposed on the FPCB 232. Accordingly, the connector 630 may be electrically connected with the ground 241.

In an embodiment, the second structure 250 may include at least one of via holes 251 and 252. The via holes 251 and 252 may pass through from the first surface of the second structure 250 to the second surface of the second structure 250.

In an embodiment, the FPCB 232 may extend from the first surface of the second structure 250 to the second surface of the second structure 250 through the via holes 251 and 252

In an embodiment, the first ground contact 610 and the second ground contact 620 may be formed on at least a portion of the FPCB 232. The first ground contact 610 and the second ground contact 620 may be arranged to be adjacent to the PCB 240. The first ground contact 610 and the second ground contact 620 may be connected with the ground 241.

In an embodiment, as the second structure 250 makes contact with one of conductive contacts 261 of the PCB 240 on the at least one point, the second structure 250 may be electrically connected with the ground 241.

In an embodiment, the first metal bezel 710 and the second metal bezel 720 may be included in the metal portion 211 of the first structure 210. The first metal bezel 710 and the second metal bezel 720 may function as radiators of the antenna.

In an embodiment, the first metal bezel 710 may be connected with the feeder 280. The feeder 280 may be disposed in the PCB 240. The first metal bezel 710 may receive power from the feeder 280 to radiate a signal having a specific frequency band. The first metal bezel 710 may be connected with the first ground contact 610. The first metal bezel 710 may be connected with the FPCB 232 through the first ground contact 610.

In an embodiment, the second metal bezel 720 may be connected with the feeder 280. The second metal bezel 720 may receive power from the feeder 280 to radiate a signal having a specific frequency band. The second metal bezel 720 may be connected with the second ground contact 620. The second metal bezel 720 may be connected with the FPCB 232 through the second ground contact 620

In an embodiment, the FPCB 232 is connected with the conductive sheet 231 such that the conductive sheet 231 functions as the ground and/or the radiator or contributes to the functions of the ground and/or the radiator.

Figure 8:
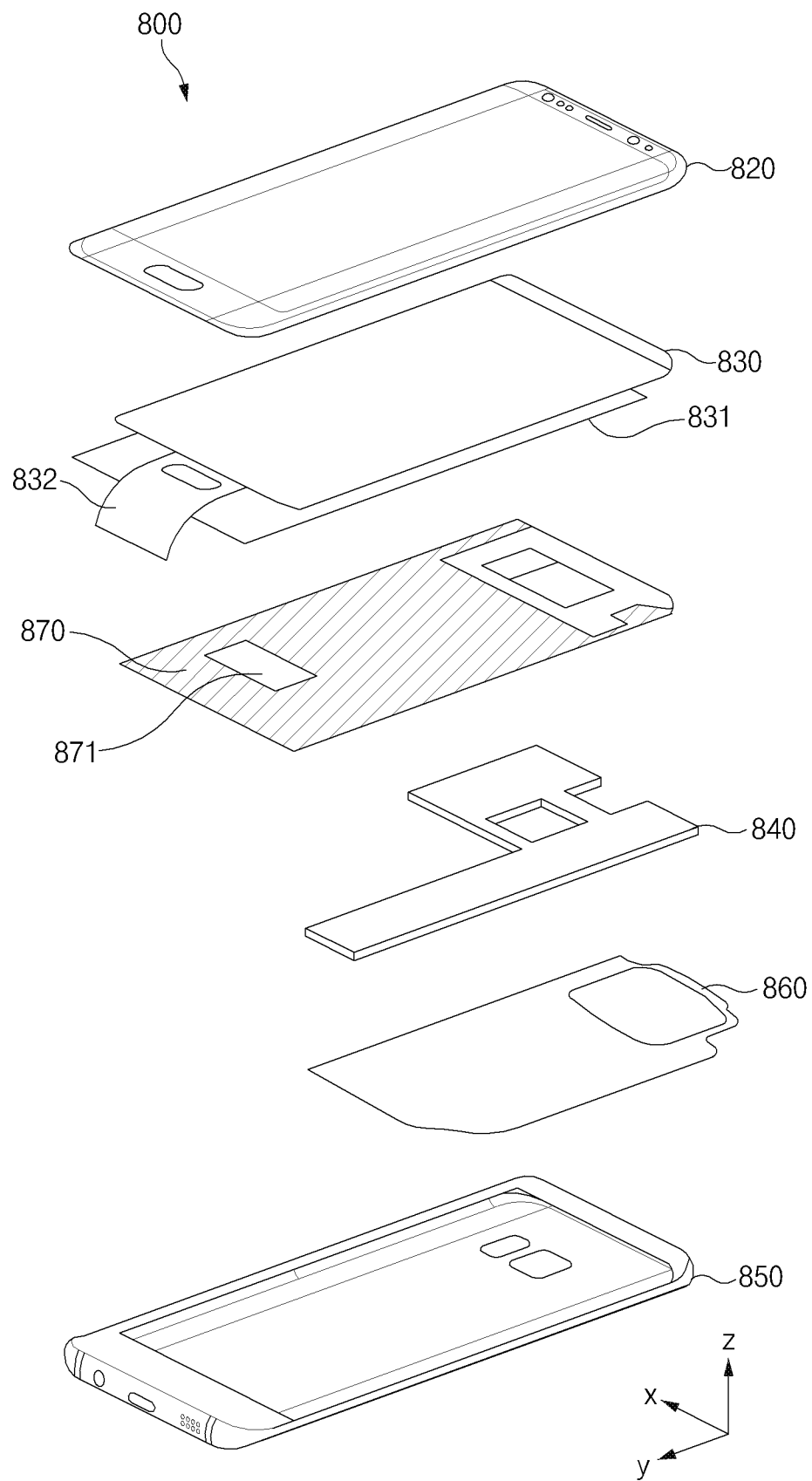
FIG. 8 is an exploded perspective view illustrating an example electronic device, according to another embodiment.
Figure 9:
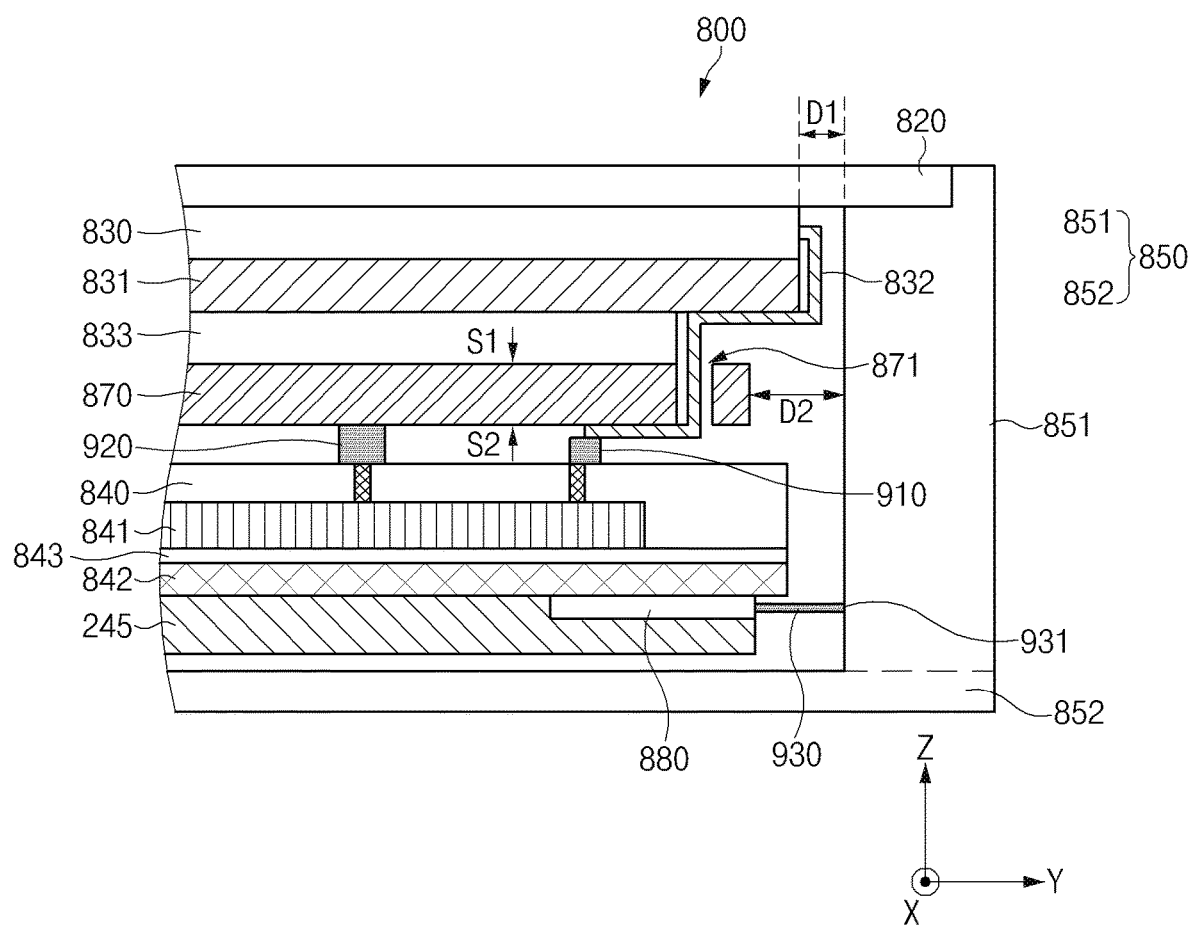
FIG. 9 is a cross-sectional view illustrating an example electronic device, according to an embodiment.

FIG. 8 is an exploded perspective view illustrating an example electronic device 800, according to another embodiment. FIG. 9 is a cross sectional view of the electronic device 800, according to another embodiment. According to another embodiment, the electronic device 800 may include a glass 820, a display panel 830, a conductive sheet 831, an FPCB 832, a PCB 840, a housing 850, a short-range communication circuit 860, a supporting member 870, a wireless communication circuitry 245, a first connection part 910, a second connection part 920, and a third connection part 930. At least one of components of the electronic device 800 illustrated in FIG. 9 may be the same as or similar to at least one of components of the electronic device 101 of FIGS. 3 and 4, and the duplicated description thereof will not be repeated here.

According to an embodiment, the housing 850 may include a side member 851 and a rear plate 852. The side member 851 may form a side surface of the electronic device 800. The rear plate 852 may form a rear surface of the electronic device 800. The side member 851 and the rear plate 852 may be integrally formed. Accordingly, the housing 850 may be formed in a single structure.

In an embodiment, the supporting member 870 may be disposed inside the electronic device 800. The supporting member 870 may form the mounting structure for parts of the electronic device 800. The supporting member 870 may separate the glass 820, the display panel 830, the conductive sheet 831, and the FPCB 832 from the PCB 840 in terms of position. For example, the glass 820, the display panel 830, the conductive sheet 831, and the FPCB 832 may be disposed on one surface of the supporting member 870 and the PCB 840 may be disposed on an opposite surface of the PCB 840. In addition, the supporting member 870 may include at least one via hole 871 or a recess to allow a connection member, which electrically connects parts disposed on opposite surfaces with each other, to pass therethrough. For example, the supporting member 870 may include the via hole 871 bored from the first surface S1 to the second surface S2.

In an embodiment, the FPCB 832 may pass through at least a portion of the supporting member 870 to connect the first connection part 910 with the conductive sheet 831. The FPCB 832 may extend from the first surface S1 of the supporting member 870 to the second surface S2 of the supporting member 870 using at least one via hole 871 or the recess included in the supporting member 870.

In an embodiment, the PCB 840 may be seated on the second surface S2 of the supporting member 870. The PCB 840 may include a ground 841 and a transmission line 842. The PCB 840 include an insulation layer 843 which is interposed between the ground 841 and the transmission line 842 to electrically isolate the ground 841 from the transmission line 842. The wireless communication circuitry 245 may be disposed on at least one surface of the PCB 840. The wireless communication circuitry 245 may be connected with the side member 851 of the housing 850 through the third connection part 930.

In an example embodiment, the FPCB 832 may pass through the supporting member 870. The FPCB 832 may extend from the conductive sheet 831 in the direction of the first surface S1 of the supporting member 870. At least one via hole 871 may be formed in at least a portion of the supporting member 870 to allow the FPCB 832 to pass through. The FPCB 832 may protrude at least partially onto the second surface S2 of the supporting member 870 through the via hole 871 formed in the supporting member 870.

In an embodiment, the second connection part 920 may electrically connect the ground 841 of the PCB 840 with the supporting member 870. For example, the second connection part 920 may be implemented with a C-clip, a metal wire, or a coaxial cable. The second connection part 920 connects the supporting member 870 with the ground 841 such that the supporting member 870 functions as the ground of the antenna.

In an embodiment, the housing 850 may form a side edge and a rear surface of the electronic device 800. At least a portion of the housing 850 may be formed of a conductive material. At least a portion of the housing 850 may be connected with the wireless communication circuitry 245 disposed on the PCB 240 using the third connection part 930 and thus used as an antenna radiator.

In an embodiment, the supporting member 870 may be interposed between the conductive sheet 831 and the PCB 840. The supporting member 870 may be attached to the conductive sheet 831 using an adhesive layer 833. The supporting member 870 may have at least one via hole 871. The FPCB 832 may extend in the direction of the Z axis from the first surface S1 of the supporting member 870 to the second surface S2 of the supporting member 870 through the via hole 871.

In an embodiment, the PCB 840 may be disposed under the supporting member 870 in the direction of the Z axis. The first connection part 910 and the second connection part 920 may be formed on the PCB 840. The top surface of the first connection part 910 may make contact with a portion, which protrudes above the second surface S2 of the supporting member 870, of the FPCB 832.

In an embodiment, the FPCB 832 may include one or more contacts to connect the ground 841 with the first connection part 910. The conductive contacts may be formed on the portion, which protrudes above the second surface S2 of the supporting member 870, of the FPCB 832. The conductive contacts may make contact with the upper portion of the first connection part 910.

In an embodiment, the second connection part 920 may electrically connect the ground 841 with the supporting member 870. The second connection part 920 may protrude, for example, from the PCB 840. At least a portion of the second connection part 920 may make contact with the second surface S2 of the supporting member 870.

In an embodiment, the conductive sheet 831 may be electrically connected with the ground 841 using the FPCB 832 and the first connection part 910. The conductive sheet 831 may be used as a portion of the antenna. When the conductive sheet 831 is used as a portion of the antenna, the radiation efficiency of the antenna toward the front side of the electronic device 101 may be improved.

Figure 10A:
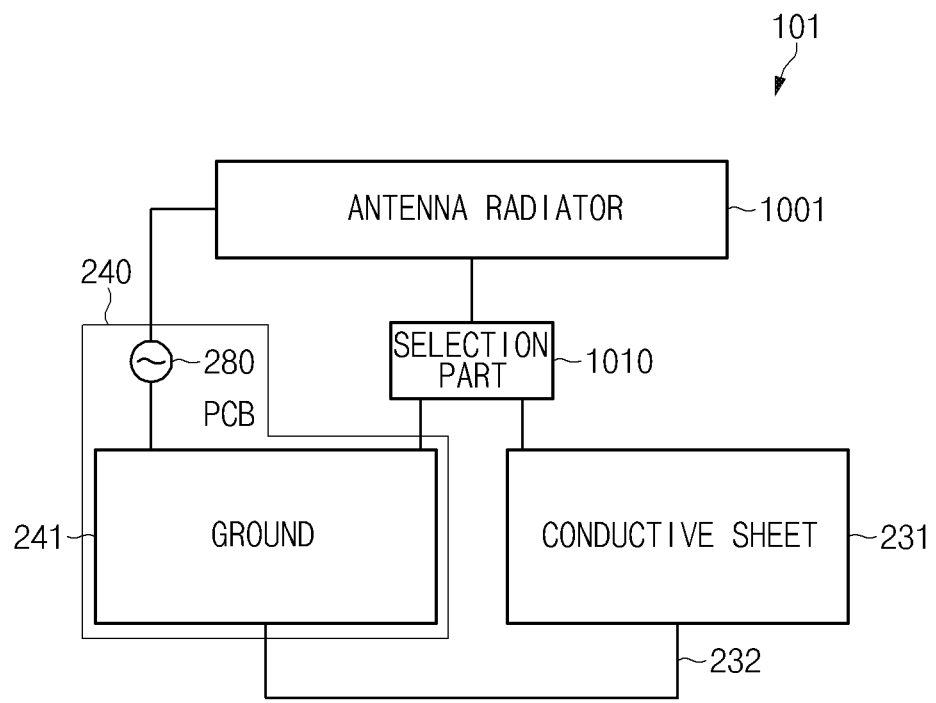
FIG. 10A is a block diagram illustrating an example electronic device, according to an embodiment.

FIG. 10A is a block diagram illustrating the electronic device 101, according to an embodiment. The electronic device 101 according to an embodiment may include at least one of an antenna radiator 1001, the conductive sheet 231, the PCB 240, the ground 241, the feeder 280, and a selection part 1010.

In an embodiment, the antenna radiator 1001 may radiate a signal having a specific frequency. The antenna radiator 1001 may receive a signal having a specific frequency. The antenna radiator 1001 may receive power from the feeder 280 of the PCB 240. The antenna radiator 1001 may be selectively connected with the ground 241 of the PCB 240 or the conductive sheet 231 through the selection part 1010. The selection part may be referred to herein as a selective connector or selective connection circuitry.

In an embodiment, the ground 241 of the PCB 240 and/or the conductive sheet 231 may be used as the ground of the antenna. The PCB 240 may be connected with the conductive sheet 231 through the FPCB 232. The ground 241 of the PCB 240 may be connected with the conductive sheet 231 such that the conductive sheet 231 functions as the ground of the antenna. The ground 241 may be selectively connected with the antenna radiator 1001 through the selection part 1010.

In an embodiment, the conductive sheet 231 may be connected with the PCB 240. The conductive sheet 231 may be connected with the ground 241 of the PCB 240 to function as the ground of the antenna. The conductive sheet 231 may be selectively connected with the antenna radiator 1001 through the selection part 1010.

In an embodiment, the feeder 280 of the PCB 240 may be configured such that the electronic device 101 radiates or receives a signal having a specific frequency band. For example, the feeder 280 may transmit a signal having the specific frequency band such that the antenna radiator 1001 operates as a radiator to radiate an RF signal.

In an embodiment, the selection part 1010 may selectively connect the antenna radiator 1001 with the ground 241 of the PCB 240 and/or the conductive sheet 231. The selection part 1010 may be implemented on the PCB 240. For example, the selection part 1010 may be implemented, on the PCB 240, for example, and without limitation, in the form of a switch such as a single pole double through (SPDT) or a double pole double through (DPDT), or a chip, an integrated circuit (IC), a module, or a block structure formed through the combination of active elements, etc. In FIG. 10A, the selection part 1010 is not limited to being separately arranged outside the PCB 240. For example, FIG. 10A is a view illustrating the electrical connection relationship among the PCB 240, the ground 241 of the PCB 240, and the selection part 1010.

In an embodiment, the selection part 1010 may be implemented with a matching circuit including at least one matching element. The selection part 1010 may select at least one matching element and may selectively connect the metal portion 211 with the ground 241 of the PCB 240 and/or the conductive sheet 231. The selection part 1010 selectively connects the metal portion 211 with the ground 241 of the PCB 240. The selection part 1010 may control the ground 241 to function as the ground of the antenna. The selection part 1010 may selectively connect the antenna radiator 1001 with the conductive sheet 231. The selection part 1010 may control the conductive sheet 231 to function as an extended ground (X-GND) selectively serving as the ground of the antenna. The selection part 1010 may expand an area used as the ground of the antenna to the conductive sheet 231 as well as the ground 241 of the PCB 240, when the connection path is selected to the conductive sheet 231.

Figure 10B:
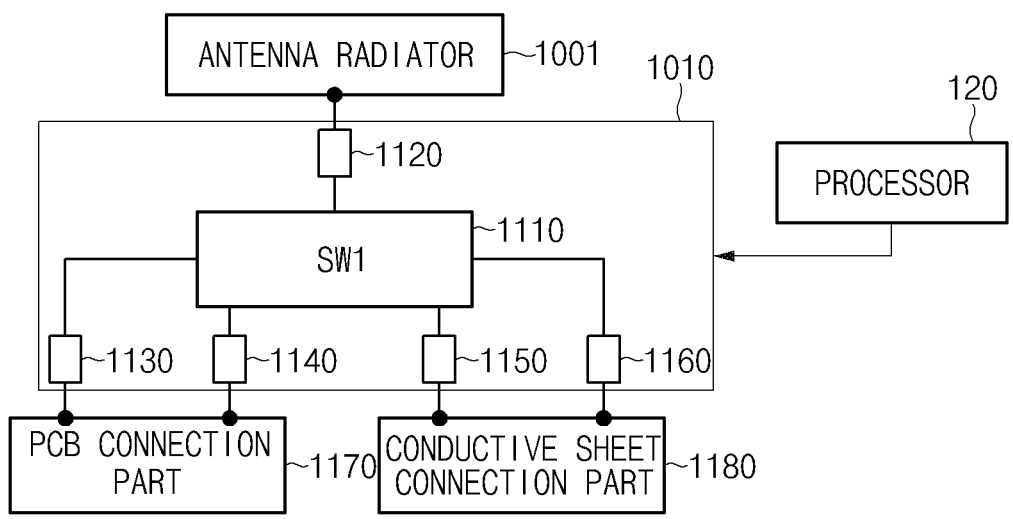
FIG. 10B is a block diagram illustrating an antenna radiator, a selection part (e.g., a selective connector), a PCB connection part, and a conductive sheet connection part, according to an embodiment.

FIG. 10B is a diagram illustrating the processor 120, the antenna radiator 1001, the selection part 1010, a PCB connection part 1170, and a conductive sheet connection part 1180.

In an embodiment, the processor 120 may control the selection part 1010. According to an embodiment, the selection part 1010 may include at least one of a first switch 1110, matching elements 1120, 1130, 1140, 1150, 1160 (which may be referred to hereinafter as matching elements 1120 to 1160), the PCB connection part 1170, or the conductive sheet connection part 1180. The processor 120 may transmit a control signal to the components included in the selection part 1010 to control the operation of the components included in the selection part 1010. For example, the processor 120 may transmit a control signal to the first switch 1110. The first switch 1110 may be turned on or turned off by receiving the control signal from the processor 120. FIG. 10B illustrates the case that the processor 120 supplies a control signal to the selection part 1010. However, the disclosure is not limited thereto, and the wireless communication circuitry 245 may control the selection part 1010 by supplying the control signal to the selection part 1010.

In an embodiment, the selection part 1010 may be a matching circuit including the first switch 1110. For example, the matching elements 1120 to 1160 may be lumped elements such as a resistor (R), inductor (L), or a capacitor (C). For another example, the selection part 1010 may include the first switch 1110 and the matching elements 1120 to 1160, and the PCB connection part 1170 and the conductive sheet connection part 1180 may be disposed separately from the selection part 1010. The PCB connection part 1170 may be referred to as the third connection part 330 of FIG. 4. The conductive sheet connection part 1180 may be referred to as the first connection part 310 of FIG. 4. The PCB connection part 1170 and the conductive sheet connection part 1180 may be implemented with connection members such as a C-clip.

In an embodiment, the first switch 1110 may selectively connect the antenna radiator 1001 with the conductive sheet 231. The first switch 1110 may selectively connect the antenna radiator 1001 with the PCB 240. The first switch 1110 may control the conductive sheet 231 and the PCB 240 to selectively perform the function as the ground of the antenna.

In an embodiment, the matching elements 1120 to 1160 may be disposed between the first switch 1110 and the antenna radiator 1001, between the first switch 1110 and the PCB connection part 1170, or between the first switch 1110 and the conductive sheet connection part 1180. The matching elements 1120 to 1160 may be implemented through the combination of a resistor, an inductor, or a capacitor. The matching elements 1120 to 1160 may be interposed between the antenna radiator 1001 and the conductive sheet 231 or between the antenna radiator 1001 and the ground 241 of the PCB 240. In the document, the antenna radiator 1001 may be the metal portion 211 of FIG. 5 or the metal portion of the metal housing (e.g., the first metal bezel 710 and the second metal bezel 720 of FIG. 7). The matching elements 1120 to 1160 may variously change physical characteristics such that a radiation characteristic, such as a resonance frequency, is changed in a specific frequency band.

In an embodiment, the PCB connection part 1170 may connect the selection part 1010 with the PCB 240. When the selection part 1010 is implemented on the PCB 240, the PCB connection part 1170 may be disposed on one surface of the PCB 240. The PCB connection part 1170 may connect the first switch 1110 of the selection part 1010 with the PCB 240 using at least some of matching elements 1130 and 1140.

In an embodiment, the conductive sheet connection part 1180 may connect the selection part 1010 with the conductive sheet 231. The conductive sheet connection part 1180 may connect the first switch 1110 of the selection part 1010 with the conductive sheet 231 using at least some of matching elements 1150 and 1160.

Figure 10C:
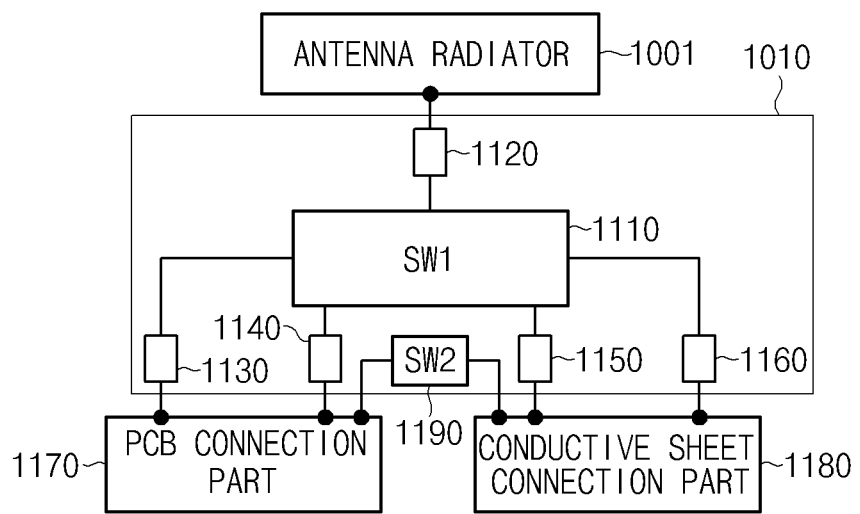
FIG. 10C is a block diagram illustrating an antenna radiator, a selection part (e.g., a selective connector), a PCB connection part, and a conductive sheet connection part, according to another embodiment.

FIG. 10C is a diagram illustrating the antenna radiator 1001, the selection part 1010, the PCB connection part 1170, and the conductive sheet connection part 1180, according to another embodiment. According to another embodiment, the selection part 1010 may be substantially identical to the selection part 1010 described with reference to FIG. 10B except that the selection part 1010 further includes a second switch 1190 interposed between the PCB connection part 1170 and the conductive sheet connection part 1180.

In an embodiment, the second switch 1190 may be a circuit implemented with the lumped element. For example, the second switch 1190 may be implemented through the combination of a resistor, an inductor, or a capacitor similarly to the matching elements 1120 to 1160. For another example, the second switch 1190 may be implemented with the same active element as that of the first switch 1110, and may be a connection switch circuit to electrically connect the PCB connection part 1170 with the conductive sheet connection part 1180 in response to the control signal received from the processor 120 or the wireless communication circuitry 245. As described above, when the second switch 1190 is interposed between the PCB connection part 1170 and the conductive sheet connection part 1180, the second switch 1190 may connect the PCB 240 with the conductive sheet 231.

FIGS. 11A, 11B, 11C, 11D, 11E and 11F are block diagrams illustrating the electronic device 101, according to another embodiment. At least one of components of the electronic device 101 illustrated in FIGS. 11A to 11F may be the same as or similar to at least one of components of the electronic device 101 of FIG. 10A, and the duplicated description thereof may not be repeated below.

Figure 11A:
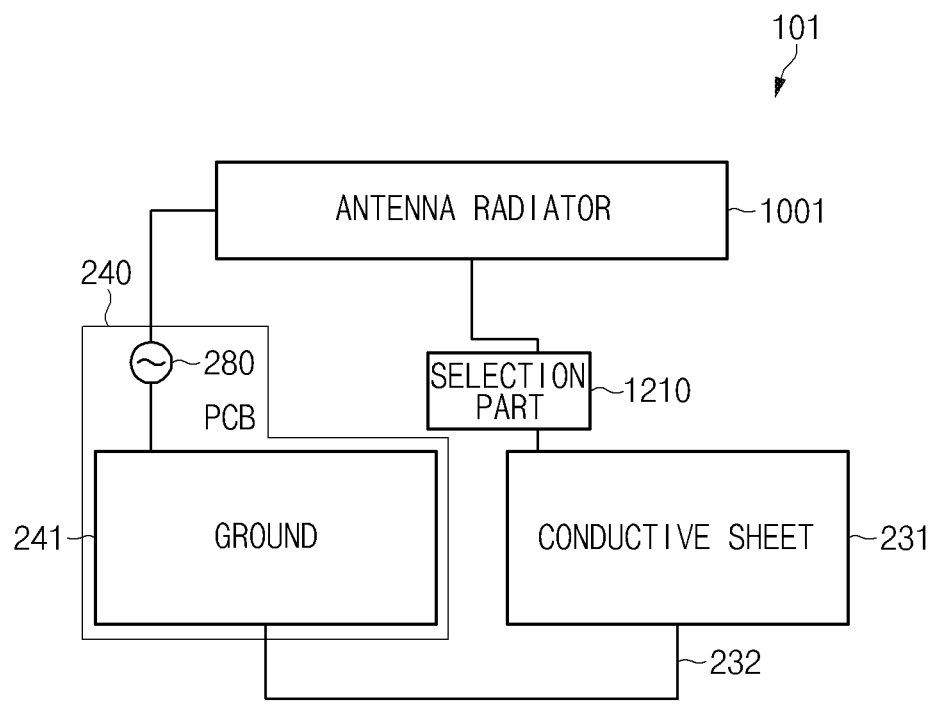
FIGS. 11A, 11B, 11C, 11D, 11E and 11F are block diagrams illustrating an example electronic device, according to various embodiments.

In an embodiment, as illustrated in FIG. 11A, the antenna radiator 1001 may be connected with the PCB 240 via the conductive sheet 231. The metal portion 211 may be selectively connected to the conductive sheet 231 using a selection part 1210. The selection part 1210 may perform substantially the same function as the selection part 1010 described with reference to FIG. 10A. For example, the selection part 1210 may be substituted with a tunable element in which a switch and an element are combined. For another example, the selection part 1210 may be a matching circuit formed separately from the switch. For another example, the selection part 1210 may include only a switch. The conductive sheet 231 may be utilized as the ground of the antenna. The conductive sheet 231 may be connected with the ground 241 of the PCB 240 through the FPCB 232.

Figure 11B:
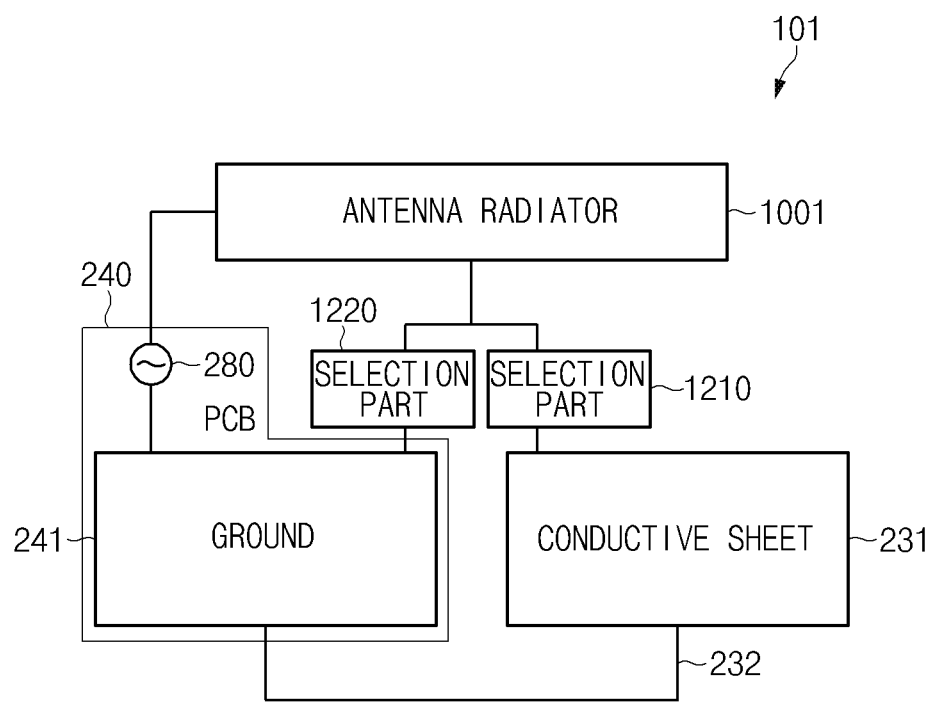

In an embodiment, as illustrated in FIG. 11B, the antenna radiator 1001 may be connected with the conductive sheet 231 and the PCB 240, respectively. The antenna radiator 1001 may be selectively connected with at least one of the conductive sheet 231 or the PCB 240 using the selection parts 1210 and 1220. The antenna radiator 1001 may utilize the conductive sheet 231 and the ground 241 of the PCB 240 as the ground of the antenna.

Figure 11C:
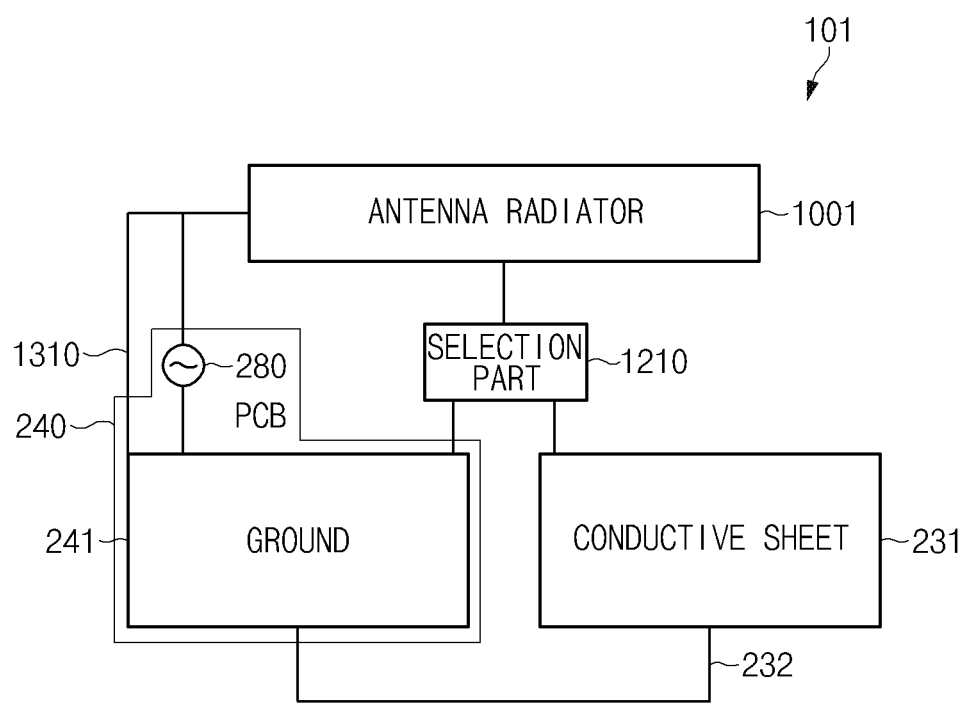

In an embodiment, as illustrated in FIG. 11C, the antenna radiator 1001 may be connected with the feeder 280 and the PCB 240 through a path 1310 formed separately from the feeder 280 and the selection part 1210. In this case, the ground 241 of the PCB 240 may be connected with the antenna radiator 1001 using the separately formed path to form the ground of the antenna. The feeder 280 may supply power to the antenna radiator 1001. The PCB 240 may ground the antenna radiator 1001 through the electrical path 1310. The antenna radiator 1001 may be directly connected with the ground 241 of the PCB 240 using the electrical path 1310 separately formed. The ground 241 of the PCB 240 may be connected with the conductive sheet 231 through the FPCB 232. The ground 241 and the conductive sheet 231 may function as the ground of the antenna.

Figure 11D:
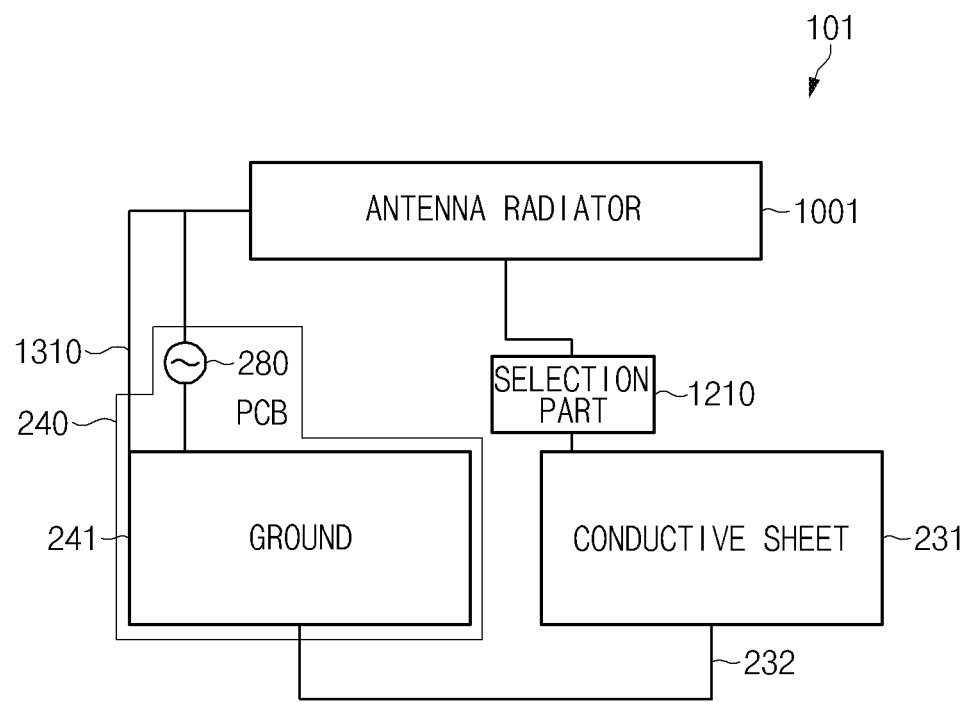

In an embodiment, as illustrated in FIG. 11D, the antenna radiator 1001 may be connected with the conductive sheet 231 through the selection part 1210 and may be directly connected with the PCB 240 through the electrical path 1310 which is separately formed. The ground 241 of the PCB 240 may be connected with the conductive sheet 231 through the FPCB 232. The ground 241 and the conductive sheet 231 may function as the ground of the antenna.

Figure 11E:
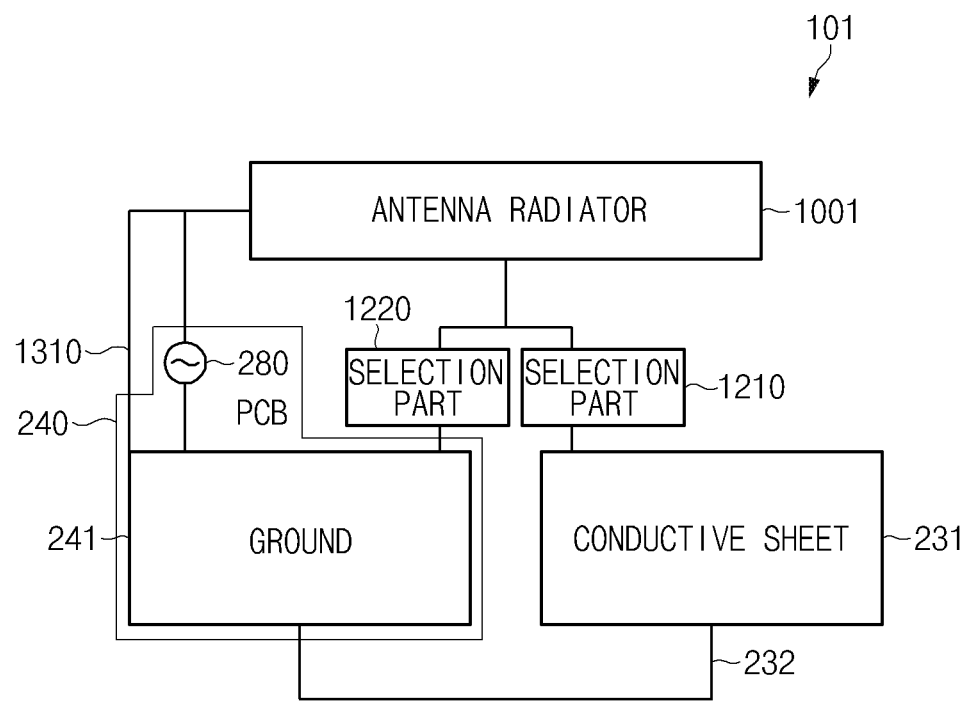

In an embodiment, as illustrated in FIG. 11E, the antenna radiator 1001 may be connected with the conductive sheet 231 and the PCB 240 through the selection parts 1210 and 1220 and/or the path which is separately formed. The ground 241 of the PCB 240 may be connected with the conductive sheet 231 through the FPCB 232. The ground 241 and the conductive sheet 231 may function as the ground of the antenna.

Figure 11F:
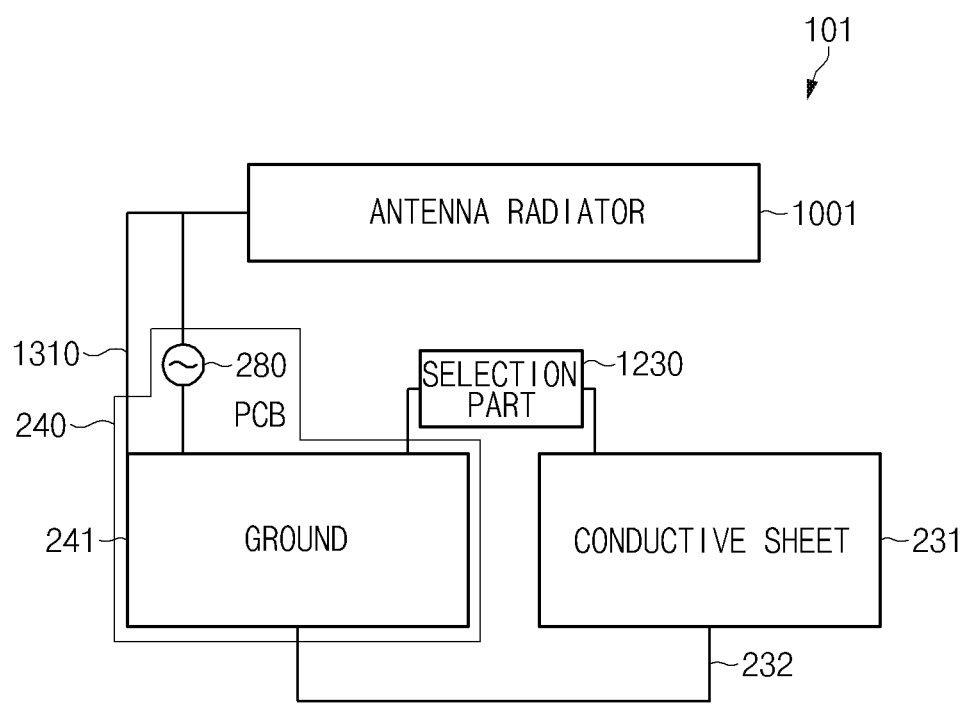

In an embodiment, as illustrated in FIG. 11F, the antenna radiator 1001 may be directly connected with the PCB 240 through a path which is separately formed. The ground 241 of the PCB 240 may be connected with the conductive sheet 231 through the FPCB 232. When the ground 241 is connected with the conductive sheet 231 through the FPCB 232 and a selection part 1230, the ground 241 and the conductive sheet 231 may be connected with each other. The ground 241 and the conductive sheet 231 may function as the ground of the antenna.

Figure 12A:
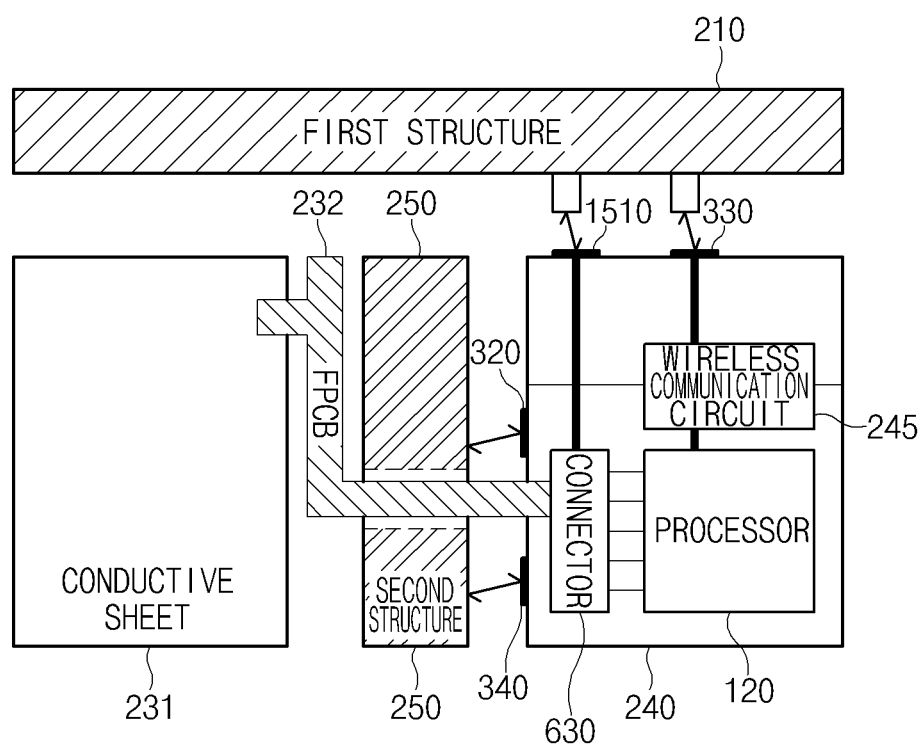
FIGS. 12A and 12B are diagrams illustrating an example electronic device, according to various embodiments.
Figure 12B:
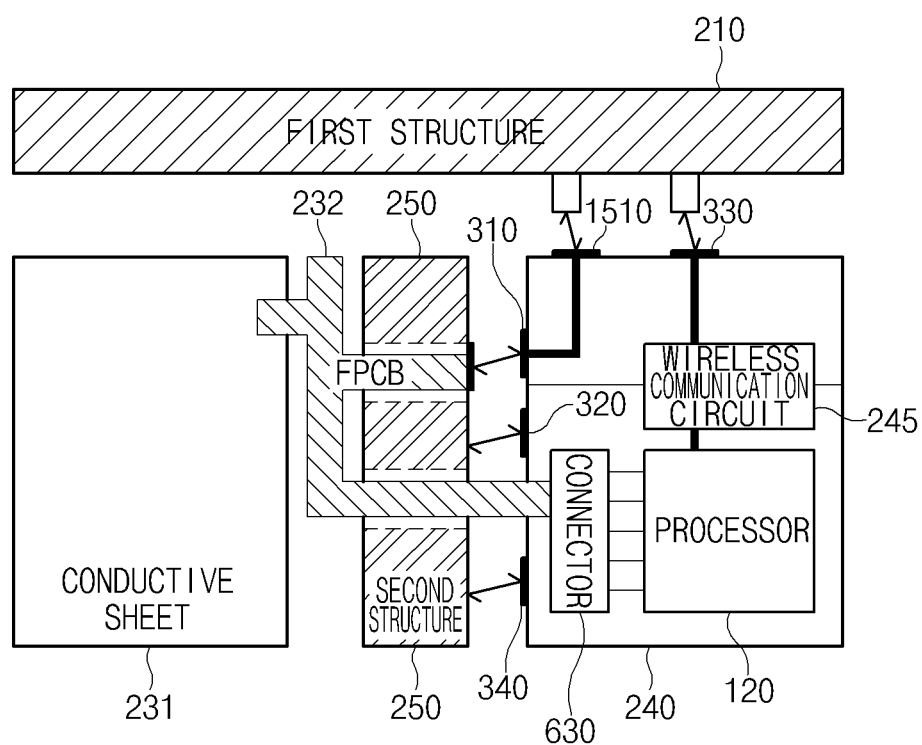

FIG. 12A is a diagram illustrating the electronic device 101, according to an embodiment. FIG. 12B is a diagram illustrating the electronic device 101, according to another embodiment. At least one of components of the electronic device 101 illustrated in FIGS. 12A and 12B may be the same as or similar to at least one of components of the electronic device 101 of FIGS. 3 and 4, and the duplicated description thereof may not be repeated below.

According to an embodiment, the wireless communication circuitry 245 may be connected with the processor 120. The wireless communication circuitry 245 may be referred to as the wireless communication module 192 of FIG. 1. The wireless communication circuitry 245 may be a circuitry to transceive a signal as the wireless communication circuitry 245 is connected with the antenna. The wireless communication circuitry 245 may be connected with the first structure 210 that forms at least a portion of the antenna. For example, the wireless communication circuitry 245 may be connected with the first structure 210 through the third connection part 330 to feed power the first structure 210.

According to an embodiment, the first structure 210 may be connected with the FPCB 232 through a ground connection part 1510. For example, as illustrated in FIG. 12A, the first structure 210 may be connected with the connector 630 through the ground connection part 1510, and may be connected with the FPCB 232 through the connector 630. As another example, as illustrated in FIG. 12B, the first structure 210 may be connected with the first connection part 310 through the ground connection part 1510 and may be connected with the FPCB 232 through the first connection part 310. The first structure 210 may function as a radiator of the antenna.

According to an embodiment, the FPCB 232 may pass through the second structure 250 from the first surface to the second surface. For example, as illustrated in FIG. 12A, the FPCB 232 may pass through at least a portion of the second structure 250 to connect the connector 630 with the conductive sheet 231. For another example, as illustrated in FIG. 12B, the FPCB 232 may pass through at least a portion of the second structure 250 to connect the connector 630 and the conductive sheet 231 and to be connected to the first connection part 310.

In an embodiment, the conductive sheet 231 may be connected with the first structure 210 through the FPCB 232. For another example, the conductive sheet 231 may be connected with the ground (e.g., the ground 241 of FIG. 4) of the PCB 240 through the second connection part 320 and a fourth connection part 340. Accordingly, the conductive sheet 231 may function as the ground of the antenna.

According to various embodiments, an electronic device may include glass comprising at least a front surface of the electronic device, a display panel disposed under the glass, a conductive sheet attached to the display panel or integrated with the display panel, a support including a first portion including a side surface of the electronic device and a second portion including a mounting space for parts, wherein the first portion of the support includes a metal portion configured to function as a radiator, and insulation portions disposed at opposite ends of the metal portion, and wherein the second portion of the support includes at least one opening or recess, a printed circuit board (PCB) including a ground, wireless communication circuitry disposed on the PCB, at least one processor operatively connected with the wireless communication circuitry, a flexible PCB (FPCB) electrically connected with the conductive sheet to operatively connect the display panel with the at least one processor, and a cover comprising a rear surface of the electronic device. The glass, the display panel, and the conductive sheet may be seated on a first surface of the second portion of the support. The PCB and the cover of the electronic device may be seated on a second surface of the second portion of the support. The second portion of the support may electrically connect the support with the ground of the PCB by making contact with one of conductive contacts of the PCB on at least one point. The FPCB 32 may have a first path extending from the first surface to the second surface through the at least one opening or recess of the support. The first path of the FPCB extending to the second surface electrically may connect the conductive sheet with the ground of the PCB. The conductive sheet may be electrically connected with the metal portion of the support through a selection part comprising selective connection circuitry. The wireless communication circuitry may receive a signal having a specific frequency band based on an electrical path formed by the wireless communication circuitry, the metal portion of the support, the selection part, and the conductive sheet.

According to an example embodiment, the wireless communication circuitry may feed power to the metal portion of support using a feeder disposed in the PCB and a third connection part connected with the feeder.

According to an example embodiment, the FPCB may extend from one side of the display panel, and may be connected with the at least one processor.

According to an example embodiment, the FPCB may have a second path extending from the first surface to the second surface through the at least one opening or recess of the support, and the second path of the FPCB extending to the second surface may be electrically connected with the metal portion of the support directly or through a switch.

According to an example embodiment, the FPCB may protrude on the second surface of the second portion of the support and ground contacts may be formed on at least a portion of a protruding surface of the FPCB, and the ground contacts may be connected with the ground of the PCB.

According to an example embodiment, a first connection part connected with the ground may be formed on a surface of the PCB which faces the second surface of the second structure of the support, and the FPCB may make contact with the first connection part.

According to an example embodiment, the PCB may include a feeder electrically connected with the wireless communication circuitry 45 to feed power to the metal portion of the support, the ground may be spaced apart from the feeder, and the ground may be connected with the second portion of the support using a second connection part.

According to an example embodiment, the FPCB may include a connector that connects the at least one processor with the PCB such that the at least one processor operates the display panel, and the connector may electrically connect the ground of the PCB with the conductive sheet.

According to various example embodiments, an electronic device may include glass comprising at least a front surface of the electronic device, a display panel disposed under the glass, a conductive sheet attached to the display panel or integrated with the display panel, a housing including a side portion comprising a side surface of the electronic device and a rear plate comprising a rear surface of the electronic device, wherein the side portion includes a metal portion, which functions as a radiator, and an insulation portion which separates the metal portion from a remaining portion of the housing, a PCB including a ground, a support to separate the glass, the display panel, and the conductive sheet from the PCB, wherein the support includes at least one via hole or recess, wireless communication circuitry disposed on the PCB, at least one processor operatively connected with the wireless communication circuitry, and a FPCB electrically connected with the conductive sheet to operatively connect the display panel with the at least one processor. The glass, the display panel, and the conductive sheet may be seated on a first surface of the support, the PCB may be disposed on a second surface of the support, the rear plate may electrically connect the housing with the ground of the PCB by making contact with one of conductive contacts of the PCB on at least one point, the FPCB may have a first path extending from the first surface to the second surface through the at least one via hole or recess of the support, the first path of the FPCB extending to the second surface electrically may connect the conductive sheet with the ground of the PCB, the conductive sheet may be electrically connected with the metal portion of the side member through a selection part comprising selective connection circuitry, and the wireless communication circuitry may receive a signal having a specific frequency band based on an electrical path formed by the wireless communication circuitry, the metal portion of the side member, the selection part, and the conductive sheet. According to an embodiment, the wireless communication circuitry may feed power to the metal portion of the side member using a feeder disposed in the PCB and a third connection part connected with the feeder. According to an embodiment, the FPCB may extend from one side of the display panel, and may be connected with the at least one processor.

According to an example embodiment, the FPCB may extend from one side of the display panel and may be connected with at least one processor.

According to an example embodiment, the FPCB may have a second path extending from the first surface to the second surface through the at least one via hole or recess of the supporting member, and the second path of the FPCB extending to the second surface may be electrically connected with the metal portion of the side portion directly or through a switch.

According to an example embodiment, the FPCB may protrude on a second surface of the supporting member and ground contacts may be formed on at least a portion of a protruding surface of the FPCB. The ground contacts may be connected with the ground of the PCB.

According to an example embodiment, a first connection part connected with the ground may be formed on a surface of the PCB, which faces the second surface of the supporting member, and the FPCB may make contact with the first connection part.

According to an example embodiment, the FPCB may include a connector that connects the at least one processor with the PCB such that the at least one processor operates the display panel, and the connector may electrically connect the ground of the PCB with the conductive sheet.

According to various example embodiments, an electronic device may include a housing including an antenna radiator, a display panel disposed inside the housing, a conductive sheet attached to the display panel or integrated with the display panel, a PCB including a ground, wireless communication circuitry disposed on the PCB to feed power to the antenna radiator, and at least one processor operatively connected with the wireless communication circuitry. The conductive sheet may be electrically connected with the ground of the PCB, and the wireless communication circuitry may be configured to receive a signal having a specific frequency band based on an electrical path between the wireless communication circuitry and the antenna radiator, or between the antenna radiator and the conductive sheet.

According to an example embodiment, the electrical path may feed a first current from the wireless communication circuitry to the antenna radiator, or feed a second current corresponding to the first current from the antennal radiator to the conductive sheet.

According to an example embodiment, the electrical path electrically may connect the conductive sheet with the ground of the PCB such that the conductive sheet is configured to be a ground of the electrical path.

According to an embodiment, the electrical path may include a feeding path extending from the wireless communication circuitry toward the antenna radiator, and a ground path extending from the metal frame toward the conductive sheet.

According to an embodiment, the antenna radiator may radiate the signal having the specific frequency band.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor(e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to various example embodiments disclosed in the disclosure, the conductive sheet of the display panel may be utilized as a portion of the ground of the antenna to improve the radiation performance of the antenna.

According to various example embodiments disclosed in the disclosure, the display panel is not pressed due to the supporting member and/or the connector on the PCB, thereby preventing and/or reducing the pixels on the display panel from being degraded.

A variety of effects directly or indirectly understood through the disclosure may be provided.

While the disclosure has been illustrated and described with reference to various example embodiments thereof, it will be understood by those skilled in the art that various changes in form and details may be made therein without departing from the spirit and scope of the disclosure as may, for example, be defined by the appended claims and their equivalents.

What is claimed is:
1. An electronic device comprising:
glass comprising at least a front surface of the electronic device;
a display panel disposed at one side of the glass;
a conductive sheet attached to the display panel or integrated with the display panel;
a support including a first portion comprising a side surface of the electronic device and a second portion comprising a mounting space for parts, wherein the first portion of the support includes a metal portion configured as a radiator, and an insulation portion disposed in at least one end of the metal portion, and wherein the second portion of the support includes at least one via hole or recess;
a printed circuit board (PCB) including a ground;
wireless communication circuitry disposed on the PCB;

at least one processor operatively connected with the wireless communication circuitry;
a flexible PCB (FPCB) electrically connected with the conductive sheet and configured to operatively connect the display panel with the at least one processor, and
a cover comprising a rear surface of the electronic device,
wherein the glass, the display panel, and the conductive sheet are seated on a first surface of the second portion of the support,
wherein the PCB and the cover of the electronic device are seated on a second surface of the second portion,
wherein the second portion of the support electrically connects the support with the ground of the PCB by making contact with one of conductive contacts of the PCB on at least one point,
wherein the FPCB includes a first path extending from a first surface to a second surface through the at least one via hole or recess of the support,
wherein the first path of the FPCB extending to the second surface electrically connects the conductive sheet with the ground of the PCB,
wherein the conductive sheet is electrically connected with the metal portion of the support through a selection part comprising selective connection circuitry, and
wherein the wireless communication circuitry is configured to receive a signal having a specific frequency band based on an electrical path including the wireless communication circuitry, the metal portion of the support, the selection part, and the conductive sheet.

2. The electronic device of claim 1, wherein the wireless communication circuitry is configured to feed power to the metal portion of the support using a feeder disposed in the PCB and a third connection part comprising a conductor connected with the feeder.

3. The electronic device of claim 1, wherein the FPCB extends from one side of the display panel, and is connected with the at least one processor.

4. The electronic device of claim 1, wherein the FPCB includes a second path extending from the first surface to the second surface through the at least one via hole or recess of the supporting member, and
wherein the second path of the FPCB extending to the second surface is electrically connected with the metal portion of the support directly or through a switch.

5. The electronic device of claim 1, wherein the FPCB protrudes on the second surface of the second portion of the support and a ground contact is provided on at least a portion of a protruding surface of the FPCB, and
wherein the ground contact is connected with the ground of the PCB.

6. The electronic device of claim 1, wherein a first connection part comprising a conductor connected with the ground is provided on a surface of the PCB facing the second surface of the second portion of the support, and
wherein the FPCB contacts the first connection part.

7. The electronic device of claim 1, wherein the PCB includes:
a feeder electrically connected with the wireless communication circuitry and configured to feed power to the metal portion of the support,
wherein the ground is spaced apart from the feeder, and
wherein the ground is connected with the second portion of the support using a second connection part.

8. The electronic device of claim 1, wherein the FPCB includes a connector connecting the at least one processor with the PCB such that the at least one processor operates the display panel, and wherein the connector electrically connects the ground of the PCB with the conductive sheet.

9. An electronic device comprising:
glass comprising at least a front surface of the electronic device;
a display panel disposed under the glass;
a conductive sheet attached to the display panel or integrated with the display panel;
a housing including a side portion comprising a side surface of the electronic device and a rear plate comprising a rear surface of the electronic device, wherein the side portion includes a metal portion configured as a radiator, and an insulation portion separating the metal portion from a remaining portion of the housing;
a printed circuit board (PCB) including a ground;
a support separating the glass, the display panel, and the conductive sheet from the PCB, wherein the support includes at least one via hole or recess,
wireless communication circuitry disposed on the PCB;
at least one processor operatively connected with the wireless communication circuitry; and
a flexible printed circuit board (FPCB) electrically connected with the conductive sheet and configured to operatively connect the display panel with the at least one processor,
wherein the glass, the display panel, and the conductive sheet are seated on a first surface of the support,
wherein the PCB is disposed on a second surface of the support,
wherein the rear plate electrically connects the housing with the ground of the PCB by making contact with one of conductive contacts of the PCB on at least one point,
wherein the FPCB includes a first path extending from a first surface to a second surface through the at least one via hole or recess of the support,
wherein the first path of the FPCB extending to the second surface electrically connects the conductive sheet with the ground of the PCB,
wherein the conductive sheet is electrically connected with the metal portion of the side portion through a selection part comprising selective connection circuitry, and
wherein the wireless communication circuitry is configured to receive a signal having a specific frequency band based on an electrical path comprising the wireless communication circuitry, the metal portion of the side portion, the selection part, and the conductive sheet.

10. The electronic device of claim 9, wherein the wireless communication circuitry is configured to feed power to the metal portion of the side portion using a feeder disposed in the PCB and a third connection part comprising a conductor connected with the feeder.

11. The electronic device of claim 10, wherein the FPCB protrudes on a second surface of the support and a ground contact is provided on at least a portion of a protruding surface of the FPCB, and
wherein the ground contact is connected with the ground of the PCB.

12. The electronic device of claim 10, wherein a first connection part comprising a conductor connected with the ground is provided on a surface of the PCB facing the second surface of the support, and
wherein the FPCB contacts the first connection part.

13. The electronic device of claim 10, wherein the FPCB includes a connector connecting the at least one processor with the PCB such that the at least one processor operates the display panel, and wherein the connector electrically connects the ground of the PCB with the conductive sheet.

14. The electronic device of claim 9, wherein the FPCB extends from one side of the display panel, and is connected with the at least one processor.

15. The electronic device of claim 9, wherein the FPCB includes a second path extending from the first surface to the second surface through the at least one via hole or recess of the support, and wherein the second path of the FPCB extending to the second surface is electrically connected with the metal portion of the side portion directly or through a switch.

16. An electronic device comprising:

a housing including an antenna radiator, a display panel disposed inside the housing;

a conductive sheet attached to the display panel or integrated with the display panel;

a PCB including a ground;

wireless communication circuitry disposed on the PCB and configured to feed power to the antenna radiator; and at least one processor operatively connected with the wireless communication circuitry;

wherein the conductive sheet is electrically connected with the ground of the PCB; and wherein the wireless communication circuitry is configured to:

receive a signal having a specific frequency band based on at least one electrical path between the wireless communication circuitry and the antenna radiator, and/or between the antenna radiator and the conductive sheet.

17. The electronic device of claim 16, wherein the electrical path is configured to feed a first current from the wireless communication circuitry to the antenna radiator, or to feed a second current corresponding to the first current from the antennal radiator to the conductive sheet.

18. The electronic device of claim 16, wherein the electrical path electrically connects the conductive sheet with the ground of the PCB such that the conductive sheet is configured to be a ground of the electrical path.

19. The electronic device of claim 18, wherein the electrical path includes:

a feeding path extending from the wireless communication circuitry toward the antenna radiator; and a ground path extending from the antenna radiator toward the conductive sheet.

20. The electronic device of claim 16, wherein the antenna radiator is configured to radiate the signal having the specific frequency band.

* * * * *